US008514151B2

(12) United States Patent
Kimura

(10) Patent No.: US 8,514,151 B2
(45) Date of Patent: *Aug. 20, 2013

(54) ELECTRONIC DEVICE AND DRIVING METHOD THEREOF

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 838 days.

This patent is subject to a terminal disclaimer.

(21) Appl. No.: 12/498,131

(22) Filed: Jul. 6, 2009

(65) Prior Publication Data

US 2009/0309823 A1  Dec. 17, 2009

Related U.S. Application Data

(60) Division of application No. 11/532,307, filed on Sep. 15, 2006, now Pat. No. 7,557,780, which is a continuation of application No. 10/619,053, filed on Jul. 15, 2003, now Pat. No. 7,113,155, and a division of application No. 09/841,098, filed on Apr. 25, 2001, now Pat. No. 6,611,108.

(30) Foreign Application Priority Data

Apr. 26, 2000 (JP) .................................. 2000-125993

(51) Int. Cl.
  *G09G 3/30* (2006.01)
  *G09G 3/34* (2006.01)
(52) U.S. Cl.
  USPC .............................................. 345/76; 345/82
(58) Field of Classification Search
  USPC ....................................................... 345/76–84
  IPC ..................................... G09G 3/3233
  See application file for complete search history.

(56) References Cited

U.S. PATENT DOCUMENTS

| 4,356,429 A | 10/1982 | Tang |
| 4,539,507 A | 9/1985 | VanSlyke |

(Continued)

FOREIGN PATENT DOCUMENTS

| EP | 0 717 445 A2 | 6/1996 |
| EP | 0 781 075 A1 | 6/1997 |

(Continued)

OTHER PUBLICATIONS

Baldo et al.; "Highly efficient phosphorescent emission from organic electroluminescent devices"; *Nature*, vol. 395; pp. 151-154; Sep. 10, 1998.

(Continued)

*Primary Examiner* — Bipin Shalwala
*Assistant Examiner* — Steven Holton
(74) *Attorney, Agent, or Firm* — Fish & Richardson P.C.

(57) ABSTRACT

A pixel is provided in which normal display of an image is possible even if a sustain period is shorter than an address period in a driving method combining digital gray scales and time gray scales, and in which operation can be compensated by changing the electric potential of a signal line even for a case in which the EL driver transistor becomes normally on due to deterioration. One of a source region and a drain region of an erasure TFT is connected to an electric current supply line, and the remaining one of the source region and the drain region is connected to a gate signal line. It is possible to change the voltage between a gate and a source of an EL driver TFT by changing the electric potential of the gate signal line so that the EL driver TFT is placed in a non-conducting state with certainty with this structure, even for cases in which the EL driver TFT becomes normally on due to a shift in the value of its threshold voltage.

15 Claims, 21 Drawing Sheets

(56) References Cited

U.S. PATENT DOCUMENTS

| | | | |
|---|---|---|---|
| 4,720,432 A | 1/1988 | VanSlyke | |
| 4,769,292 A | 9/1988 | Tang | |
| 4,885,211 A | 12/1989 | Tang | |
| 4,950,950 A | 8/1990 | Perry | |
| 5,047,687 A | 9/1991 | VanSlyke | |
| 5,059,861 A | 10/1991 | Littman | |
| 5,073,446 A | 12/1991 | Scozzafava | |
| 5,151,629 A | 9/1992 | VanSlyke | |
| 5,247,190 A | 9/1993 | Friend | |
| 5,294,869 A | 3/1994 | Tang | |
| 5,294,870 A | 3/1994 | Tang | |
| 5,399,502 A | 3/1995 | Friend | |
| 5,592,199 A * | 1/1997 | Kawaguchi et al. | 345/206 |
| 5,687,465 A * | 11/1997 | Hinata et al. | 29/402.01 |
| 5,839,456 A | 11/1998 | Han | |
| 5,893,637 A * | 4/1999 | Mizuno | 362/489 |
| 5,943,032 A | 8/1999 | Nagaoka | |
| 5,952,789 A | 9/1999 | Stewart | |
| 5,962,962 A | 10/1999 | Fujita | |
| 5,990,629 A | 11/1999 | Yamada et al. | |
| 6,091,203 A | 7/2000 | Kawashima | |
| 6,215,245 B1 | 4/2001 | Mori | |
| 6,229,506 B1 | 5/2001 | Dawson | |
| 6,246,180 B1 * | 6/2001 | Nishigaki | 315/169.3 |
| 6,274,887 B1 * | 8/2001 | Yamazaki et al. | 257/72 |
| 6,281,552 B1 * | 8/2001 | Kawasaki et al. | 257/350 |
| 6,362,798 B1 * | 3/2002 | Kimura et al. | 345/55 |
| 6,384,427 B1 | 5/2002 | Yamazaki et al. | |
| 6,392,617 B1 | 5/2002 | Gleason | |
| 6,414,653 B1 | 7/2002 | Kobayashi | |
| 6,424,326 B2 | 7/2002 | Yamazaki | |
| 6,548,960 B2 | 4/2003 | Inukai | |
| 6,580,094 B1 | 6/2003 | Yamazaki et al. | |
| 6,611,108 B2 | 8/2003 | Kimura | |
| 6,670,637 B2 | 12/2003 | Yamazaki et al. | |
| 6,730,966 B2 | 5/2004 | Koyama | |
| 6,756,740 B2 | 6/2004 | Inukai | |
| 6,791,129 B2 | 9/2004 | Inukai | |
| 6,809,343 B2 | 10/2004 | Yamazaki et al. | |
| 6,847,341 B2 | 1/2005 | Kimura | |
| 6,903,731 B2 | 6/2005 | Inukai | |
| 6,982,462 B2 | 1/2006 | Koyama | |
| 6,995,520 B2 | 2/2006 | Inukai | |
| 7,113,155 B2 | 9/2006 | Kimura | |
| 7,173,584 B2 | 2/2007 | Kimura et al. | |
| 7,208,765 B2 | 4/2007 | Yamazaki et al. | |
| 7,279,752 B2 | 10/2007 | Yamazaki et al. | |
| 7,557,780 B2 | 7/2009 | Kimura | |
| 8,017,945 B2 | 9/2011 | Yamazaki et al. | |
| 2002/0000576 A1 | 1/2002 | Inukai | |
| 2002/0044140 A1 | 4/2002 | Inukai | |
| 2002/0053884 A1 | 5/2002 | Kimura | |
| 2002/0070913 A1 | 6/2002 | Kimura et al. | |
| 2002/0113760 A1 | 8/2002 | Kimura | |
| 2005/0200576 A1 | 9/2005 | Kimura | |
| 2006/0256047 A1 | 11/2006 | Kimura et al. | |
| 2008/0316152 A1 | 12/2008 | Kimura et al. | |
| 2011/0122124 A1 | 5/2011 | Kimura et al. | |

FOREIGN PATENT DOCUMENTS

| | | |
|---|---|---|
| EP | 1 003 150 A1 | 5/2000 |
| EP | 1 061 497 | 12/2000 |
| EP | 1 103 946 A2 | 5/2001 |
| EP | 1 111 574 A2 | 6/2001 |
| EP | 1 148 467 A2 | 10/2001 |
| EP | 1 594 116 A2 | 11/2005 |
| EP | 2 237 256 A2 | 10/2010 |
| EP | 2 280 389 A1 | 2/2011 |
| EP | 2 280 390 A1 | 2/2011 |
| JP | 04-328791 A | 11/1992 |
| JP | 06-132533 A | 5/1994 |
| JP | 08-078159 | 3/1996 |
| JP | 08-241048 | 9/1996 |
| JP | 09-132774 A | 5/1997 |
| JP | 10-92576 A | 4/1998 |
| JP | 10-134959 A | 5/1998 |
| JP | 10-189525 | 7/1998 |
| JP | 10-319908 A | 12/1998 |
| JP | 10-333641 A | 12/1998 |
| JP | 11-003782 A | 1/1999 |
| JP | 11-026169 A | 1/1999 |
| JP | 11-145136 A | 5/1999 |
| JP | 11-272233 A | 10/1999 |
| JP | 11-329719 A | 11/1999 |
| JP | 11-338786 A | 12/1999 |
| JP | 2000-113976 A | 4/2000 |
| JP | 2000-221942 | 8/2000 |
| JP | 2000-235370 | 8/2000 |
| JP | 2000-347621 | 12/2000 |
| JP | 2001-42822 | 2/2001 |
| JP | 2001-60076 | 3/2001 |
| JP | 2001-242827 A | 9/2001 |
| JP | 2001-343933 | 12/2001 |
| JP | 2002-014653 A | 1/2002 |
| JP | 2002-023696 A | 1/2002 |
| WO | WO 90/13148 | 11/1990 |
| WO | 98/33165 A1 | 7/1998 |

OTHER PUBLICATIONS

Baldo et al.; "Very high-efficiency green organic light-emitting devices based on electrophosphorescence"; *Applied Physics Letters*, vol. 75, No. 1; pp. 4-6; Jul. 5, 1999.

Han et al.; "Green OLED with low temperature poly Si TFT"; *EuroDisplay '99 Late-news papers*; pp. 27-30; Sep. 6-9, 1999.

Kazutaka Inukai, "Electronic Device", specification, claims and drawings, filed Nov. 28, 2000, U.S. Appl. No. 09/724,387.

Kimura et al.; "Low Temperature Poly-Si TFT Driven Light-Emitting Polymer Display and Digital Gray Scale for Uniformity"; *IDW 99*; pp. 171-174; 1999.

Kimura et al.; "TFT-LEPD with Image Uniformity by Area Ratio Gray Scale"; *EuroDisplay '99 Late-news papers*; pp. 71-74; Sep. 6-9, 1999.

Schenk et al.; "Polymers for Light Emitting Diodes"; *Euro Display Proceedings 1999*; pp. 33-37; 1999.

Shimoda et al.; "Current Status and Future of Light-Emitting Polymer Display Driven by Poly-Si TFT"; *SID 99 Digest*; pp. 372-375; 1999.

Shimoda et al.; "High Resolution Light Emitting Polymer Display Driven by Low Temperature Polysilicon Thin Film Transistor with Integrated Driver"; *Asia Display 98*; pp. 217-220; 1998.

Shimoda et al.; "Technology for Active Matrix Light Emitting Polymer Displays"; *IEDM 99*; pp. 107-110; 1999.

Tsutsui et al.; "High Quantum Efficiency in Organic Light-Emitting Devices with Iridium-Complex as a Triplet Emissive Center"; *Japanese Journal of Applied Physics*, vol. 38; pp. L1502-L1504; Part 2, No. 12B; Dec. 15, 1999.

Tsutsui et al.; "Electroluminescence in Organic Thin Films"; *Photochemical Processes in Organized Molecular Systems*; pp. 437-450; 1991.

* cited by examiner voltage between gate and source of EL driver TFT 1702 voltage between gate and source of EL driver TFT

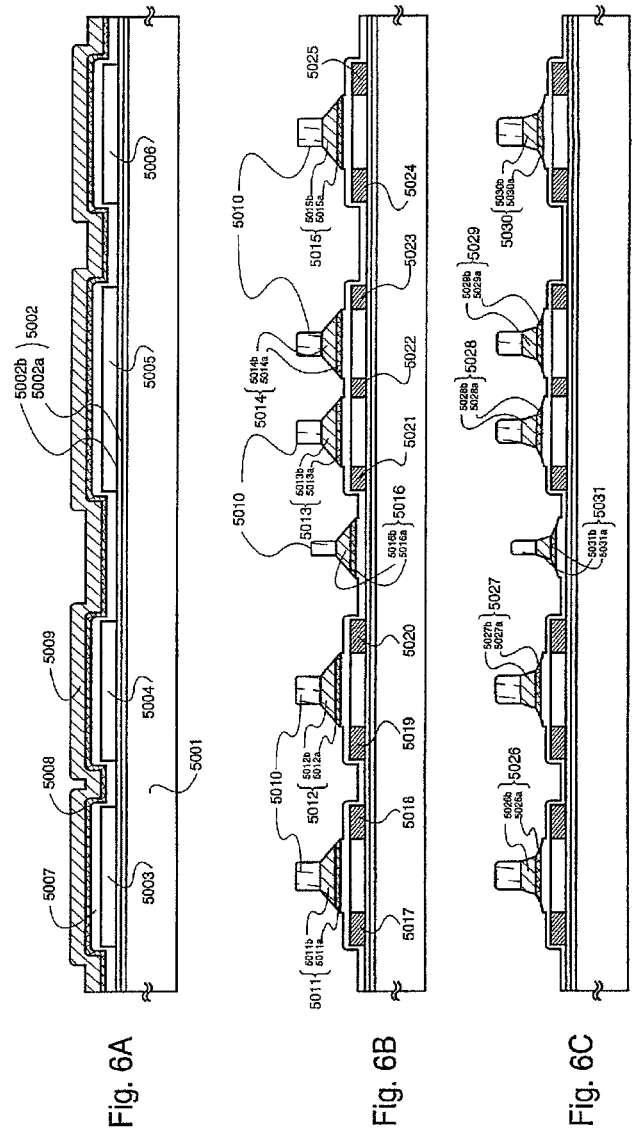

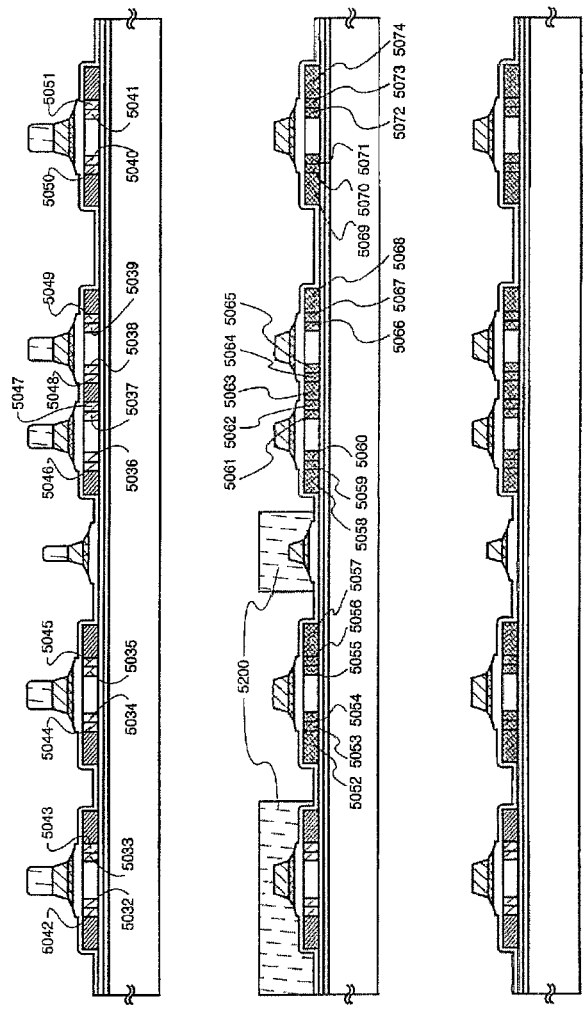

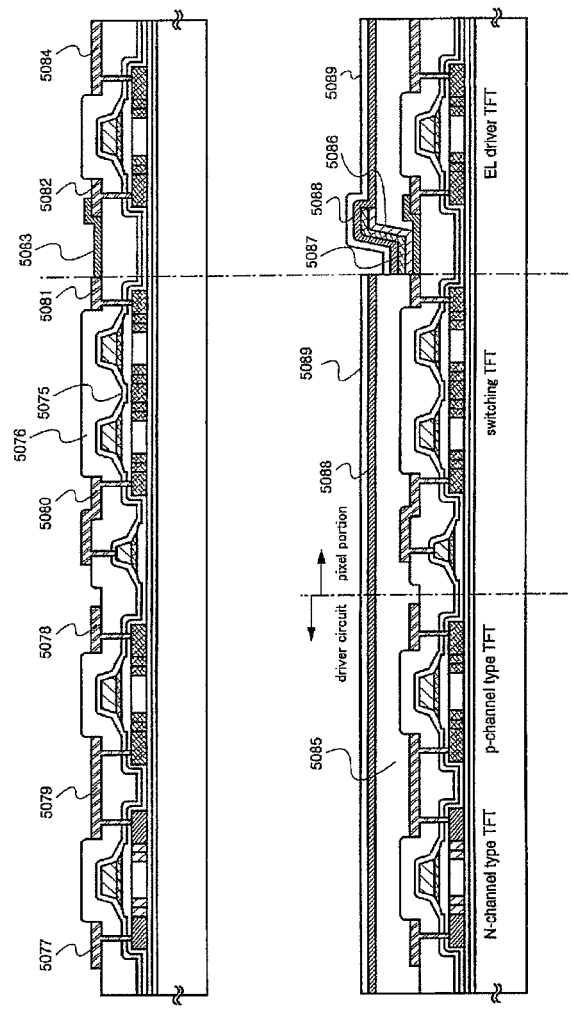

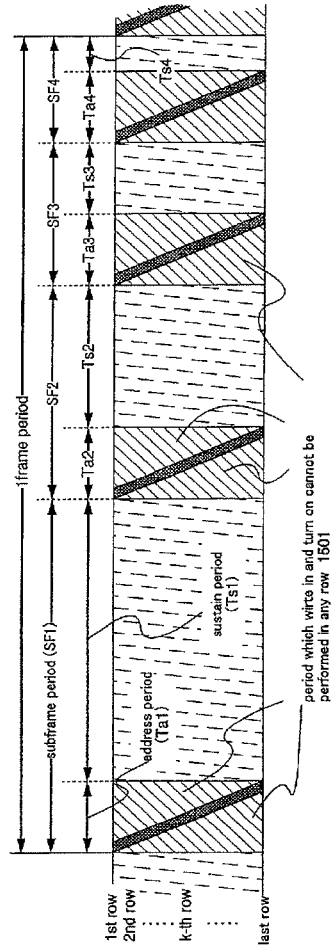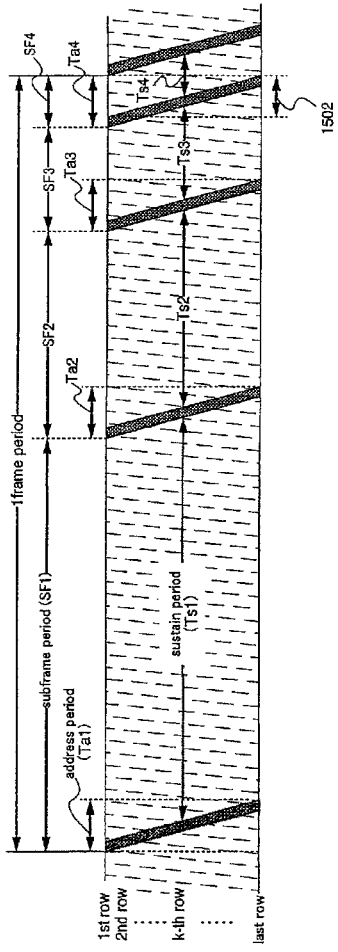
Fig. 15A
Fig. 15B

ELECTRONIC DEVICE AND DRIVING METHOD THEREOF

CROSS-REFERENCE TO RELATED APPLICATIONS

This application is a divisional of U.S. application Ser. No. 11/532,307, filed Sep. 15, 2006, now allowed which is a continuation of U.S. application Ser. No. 10/619,053, filed Jul. 15, 2003, now U.S. Pat. No. 7,113,155, which is a divisional of U.S. application Ser. No. 09/841,098, filed Apr. 25, 2001, now U.S. Pat. No. 6,611,108, which claims the benefit of a foreign priority application filed in Japan as Serial No. 2000-125993 on Apr. 26, 2000, all of which is incorporated by reference.

BACKGROUND OF THE INVENTION

1. Field of the Invention

The present invention relates to an electronic device structure. In particular, the present invention relates to an active matrix electronic device having a thin film transistor (TFT) formed on an insulating body, and to a method of driving an active matrix electronic device.

2. Description of the Related Art

EL displays (also referred to as electroluminescence displays) have been gathering attention in recent years as flat panel displays, which are substitutes for LCDs (liquid crystal displays), and research into such displays is proceeding apace.

LCDs can roughly be divided into two types of driving methods. One is a passive matrix type used in an LCD such as an STN-LCD, and the other is an active matrix type used in an LCD such as a TFT-LCD. EL displays can also be similarly broken down roughly into two types. One is a passive matrix type, and the other is an active matrix type.

For the passive matrix type, wirings which become electrodes are arranged in portions above and below EL elements (also referred to as electroluminescence elements). Voltages are applied to the wirings in order, and the EL elements turn on due to the flow of an electric current. On the other hand, each pixel has a thin film transistor with the active matrix type, and a signal can be stored within each pixel.

A schematic diagram of an active EL display device is shown in FIGS. 13A and 13B. FIG. 13A is a schematic diagram of an entire circuit, and a substrate 1350 has a pixel portion 1353 in its center. Gate signal line driver circuits 1352 for controlling gate signal lines are arranged to the left and right of the pixel portion. The arrangement may also be on only one side, left or right, but considering such issues as operational efficiency and reliability, it is preferable to use both positions as shown in FIG. 13A. A source signal line driver circuit 1351 for controlling source signal lines is arranged above the pixel portion. One pixel portion circuit in the pixel portion 1353 of FIG. 13A is shown in FIG. 13B. Reference numeral 1301 denotes a TFT which functions as a switching element during write in to the pixel (hereafter referred to as a switching TFT) in FIG. 13B. Reference numeral 1302 denotes a TFT which functions as an element (electric current control element) for controlling electric current supplied to EL elements 1303 (hereafter referred to as an EL driver TFT). The EL driver TFT 1302 is arranged between an anode of the EL element 1303 and an electric current supply line 1307 in FIG. 13B. It is also possible, as a separate structuring method, to arrange the EL driver TFT 1302 between a cathode of the EL element 1303 and a cathode electrode 1308. However, from the fact that it is good for TFT operation to have a source region connected to ground, and from limitations on the manufacture of the EL elements 1303, a method in which a p-channel TFT is used in the EL driver TFT 1302 and is arranged between the anode of the EL element 1303 and the electric current supply line 1307 is generally seen and often employed. Reference numeral 1304 denotes a storage capacitor for storing a signal (voltage) input from a source signal line 1306. One terminal of the storage capacitor 1304 is connected to the electric current supply line 1307 in FIG. 13B, but a specialized wiring may also be used. A gate electrode of the switching TFT 1301 is connected to a gate signal line 1305, and a source region of the switching TFT 1301 is connected to the source signal line 1306. Further, a drain region of the EL driver TFT 1302 is connected to an anode 1309 of the EL element 1303, and a source region of the EL driver TFT 1302 is connected to the electric current supply line 1307.

The EL element has a layer (hereafter referred to as an EL layer) containing an organic compound in which electroluminescence (luminescence generated by the addition of an electric field) is obtained, an anode, and a cathode. As to the luminescence in the organic compound, there is emission of light when returning to a ground state from a singlet excitation state (fluorescence), and emission of light when returning to a ground state from a triplet excitation state (phosphorescence), and the electronic device of the present invention may use both types of light emission.

Note that all layers formed between the anode and the cathode are defined as EL layers in this specification. Specifically, layers such as a light emitting layer, a hole injecting layer, an electron injecting layer, a hole transporting layer, and an electron transporting layer are included as EL layers. An EL element basically has a structure in which an anode, a light emitting layer, and a cathode are laminated in order. In addition to this structure, the EL element may also have a structure in which an anode, a hole injecting layer, a light emitting layer, and a cathode are laminated in order, or a structure in which an anode, a hole injecting layer, a light emitting layer, an electron transporting layer, and a cathode are laminated in order.

Furthermore, an element formed by an anode, an EL layer, and a cathode is referred to as an EL element within this specification.

Circuit operation of an active matrix electronic device is explained next with reference to FIGS. 13A and 13B. First, a voltage is applied to the gate electrode of the switching TFT 1301 when the gate signal line 1305 is selected, and the switching TFT 1301 is placed in a conducting state. The signal (voltage) of the source signal line 1306 is thus stored in the storage capacitor 1304. The voltage of the storage capacitor 1304 becomes a voltage $V_{GS}$ between the gate and the source of the EL driver TFT 1302, and therefore the electric current in response to the storage capacitor 1304 voltage flows in the EL driver TFT 1302 and in the EL element 1303. As a result, the EL element 1303 turns on.

The brightness of the EL element 1303, namely the amount of electric current flowing in the EL element 1303, can be controlled by $V_{GS}$ of the EL driver TFT 1302. $V_{GS}$ is the voltage stored in the storage capacitor 1304, and is the signal (voltage) inputted to the source signal line 1306. In other words, the brightness of the EL element 1303 is controlled by controlling the signal (voltage) of the source signal line 1306. Finally, the gate signal line 1305 is unselected, the gate of the switching TFT 1301 is closed, and the switching TFT 1301 is placed in a non-conducting state. The electric charge stored in the storage capacitor 1304 continues to be stored at this point. $V_{GS}$ of the EL driver 1302 is therefore stored as is, and the electric current in response to $V_{GS}$ continues to flow in the EL driver TFT 1302 and in the EL element 1303.

Information regarding the above explanation is reported upon in papers such as the following: "Current Status and Future of Light-Emitting Polymer Display Driven by poly-Si TFT", SID99 Digest, p. 372; "High Resolution Light Emitting Polymer Display Driven by Low Temperature Polysilicon Thin Film Transistor with Integrated Driver", ASIA DISPLAY 98, p. 217; and "3.8 Green OLED with Low Temperature Poly-Si TFT", Euro Display 99 Late News, p. 27.

Analog gray scale methods and digital gray scale methods exist as methods of gray scale expression for an EL display. In the analog gray scale method, the value of $V_{GS}$ of the EL driver TFT 1302 is changed, the amount of electric current flowing in the EL element 1303 is controlled, and the brightness is changed in an analog manner. In the digital gray scale method, on the other hand, the voltage between the gate and the source of the EL driver TFT operates at only two levels: a range in which no electric current flows in the EL element 1303 (equal to or less than the turn on start voltage); and a range in which the maximum electric current flows (equal to or greater than the brightness saturation voltage). In other words, the EL element 1303 only takes turned-on and turned-off states.

EL displays mainly use the digital gray scale method, in which dispersion in characteristics such as the threshold voltage of a TFT does not easily influence display. However, only two-gray-scale display, turned on and turned off, can be performed as is with the digital gray scale method, and therefore plural techniques capable of multiple gray scales by combining the digital gray scale method with another method have been proposed.

One of these techniques is a method in which a surface area gray scale method and a digital gray scale method are combined. The surface area gray scale method is a method of outputting gray scales by controlling the surface area of portions which are switched on. Namely, one pixel is divided into a plurality of sub-pixels, and the number of sub-pixels turned on and the surface area are controlled, and a gray scale is expressed.

FIGS. 14A and 14B are examples of pixel structures for performing gray scale expression in accordance with the surface area gray scale method. A region surrounded by a dotted line frame 1400 in FIG. 14A is a one pixel portion circuit. An enlarged diagram is shown in FIG. 14B. Reference numeral 1401 denotes a first switching TFT, reference numeral 1402 denotes a second switching TFT, reference 1403 denotes a first EL driver TFT, 1404 denotes a second EL driver TFT, 1405 denotes a first EL element, 1406 denotes a second EL element, and reference numeral 1407 is a third EL element. Reference numeral 1408 denotes a first storage capacitor, reference numeral 1409 denotes a second storage capacitor, 1410 denotes a gate signal line, 1411 denotes a first source signal line, 1412 denotes a second source signal line, and reference numeral 1413 is an electric current supply line.

The first switching TFT 1401 and the second switching TFT 1402 are first placed in a conducting state by selecting the gate signal line 1410 in the gray scale expression method. When a signal is not inputted to the source signal line, no EL elements turn on (gray scale 0). When a signal is inputted to the first source signal line 1411, the first EL driver TFT 1403 is placed into a conducting state via the first switching TFT 1401, electric current is supplied to the first EL element 1405, and it turns on. A signal is not inputted to the second source signal line 1412 at this point, and the second EL element 1406 and the third EL element 1407 are in OFF states (gray scale 1).

Next, if a signal is inputted to the second source signal line 1412, then the second EL driver TFT 1404 is placed in a conducting state via the second switching TFT 1402, electric current is supplied to the second EL element 1406 and the third EL element 1407, and they turn on. A signal is not inputted to the first source signal line 1411 at this point, and the first EL element 1405 is in a turned-off state (gray scale 2). Finally, when a signal is inputted to both the first source signal line 1411 and the second source signal line 1412, the first EL driver TFT 1403 and the second EL driver TFT 1404 are placed in conducting states via the first switching TFT 1401 and the second switching TFT 1402, electric current is supplied to the first EL element 1405, the second EL element 1406, and the third EL element 1407, and they turn on. All of the EL elements of one pixel turn on at this stage (gray scale 3). Four levels of gray scale expression can thus be performed in the pixel shown in FIGS. 14A and 14B.

Note that, in order to clarify the surface area of the turned on EL elements in FIGS. 14A and 14B, the second and the third EL elements are shown separately, but it is of course also possible to arrange only the second EL element having a surface area equal to twice that of the first EL element.

Disadvantages of this method include fact that it is difficult to increase the resolution, and fact that it is difficult to make a lot of gray scales, because the number of sub-pixels cannot be made large without limits. The surface area gray scale method is reported in papers such as: "TFT-LEPD with Image Uniformity by Area Ratio Gray Scale", Euro Display 99 Late News, p. 71; and "Technology for Active Matrix Light Emitting Polymer Displays", IEDM 99, p. 107.

Another method capable of making many gray scales is a method which combines a time gray scale method and a digital gray scale method. The time gray scale method is a method of outputting gray scales by controlling the amount of turn on time. In other words, one frame period is divided into a plurality of subframe periods, and gray scales are expressed by controlling the number and length of the subframe periods turned on.

A case of combining the digital gray scale method, the surface area gray scale method, and the time gray scale method is reported in "Low-Temperature Poly-Si TFT driven Light-Emitting-Polymer Displays and Digital Gray Scale for Uniformity", IDW' 99, p. 171.

FIGS. 15A and 15B are timing charts for a driving method in which digital gray scales and time gray scales are combined. FIG. 15A shows a timing chart for a case in which address (write in) periods and sustain (turn on) periods are completely separated within a subframe period, while a case in which they are not separated is shown in FIG. 15B.

It is normally necessary to form address (write in) periods and sustain (turn on) periods corresponding to the number of bits in a driving method utilizing time gray scales. With a driving method in which the address (write in) periods and sustain (turn on) periods are completely separated (a driving method in which the sustain (turn on) period begins after the address (write in) period of one pixel portion completely finishes in each subframe period), the proportion within one frame period occupied by the address (write in) period becomes large. Further, as shown in FIG. 15A, a period 1501 develops, in which write in and turn on cannot be performed in other rows, during a period in which the gate signal line of a certain row is selected within the address (write in) period. The duty ratio (the length proportion of the sustain (turn on) period within one frame period) is thus greatly reduced. Increasing the operational clock frequency is the only way to shorten the address (write in) period, and considering things such as the circuit operating margin, there are limits to making multiple gray scales. Conversely, with a driving method in which the address (write in) periods and sustain (turn on) periods are not separated, for example, the sustain (turn on) period for the EL element of a number k row, begins immediately after the selection period for the gate signal line of the number k row is completed. Therefore, the pixel is placed in an ON state even during times when the gate signal line is selected by other rows. This is consequently an advantageous driving method for making the duty ratio higher.

Problems such as the following appear, however, when the address (write in) periods and the sustain (turn on) periods are not separated. The length of one address (write in) period is from the start of the selection period for the first row gate signal line until the completion of the selection period of the last row gate signal line. At a certain point, selection of two differing gate signal lines cannot be performed, and therefore it is necessary for the sustain (turn on) period to have a length at least the same as, or greater than, the length of the address (write in) period for a driving method in which the address (write in) periods and sustain (turn on) periods are not separated. The ability to make multiple gray scales is therefore limited by the minimum unit of the sustain (turn on) period. In FIG. 15B, the length of a portion shown by reference numeral 1502, in which a period up through the completion of an address (write in) period $Ta_4$ of the least significant bit portion of a subframe period $SF_4$ does not overlap with a period from the beginning of the first address (write in) period of the next frame period, becomes the minimum unit. Normal display cannot be performed if the sustain (turn on) period has a shorter length. The length of the minimum unit of the sustain (turn on) period $Ts_{min}$ is expressed by $Ts_{min}=Ta_n-Tg_n$ if the length of the address (write in) period is taken as $Ta_n$ and the length of the selection period for one gate signal line is taken as $Tg_n$. The lengths of the sustain (turn on) periods for cases in which the digital gray scale method is combined with the time gray scale method are therefore determined by ratios of powers of 2, and considering the length of one frame period, it becomes difficult to realize multiple gray scales.

A problem in which the minimum unit of the sustain (turn on) period is limited for cases in which the address (write in) period and the sustain (turn on) period are not separated is stated in the above timing charts. The following display method has been proposed in order to resolve this problem.

A sustain (turn on) period $Ts_3$ which is shorter than the minimum unit $Ts_{min}$ is contained within one frame period, and therefore a portion of $Ta_3$ and a portion of the next frame period $Ta_1$ which starts after the completion of $Ts_3$ are in a state of overlapping in a region denoted by reference numeral 1601 in FIG. 16A. Gate signal lines of differing columns are selected at the same time with this type of overlap portion, and therefore normal scanning cannot be performed. As shown in FIG. 16B, a period 1602 in which the EL element is in a non-display state is then formed in the period in which, the address (write in) period overlaps after the completion of the sustain (turn on) period having a length shorter than the minimum unit $Ts_{min}$, and the start timing of the next address (write in) period is delayed. Overlap of the address (write in) period disappears even when sustain (turn on) periods shorter than the minimum unit $Ts_{min}$ are included, and normal display can consequently be performed.

FIGS. 17A and 17B show pixel structures recorded in Japanese Patent Application No. Hei 11-338786 (applied on Nov. 29, 1999). A range contained within a dotted line frame 1700 in FIG. 17A is one pixel portion. FIG. 17B shows an enlargement diagram of FIG. 17A. Adding to the structure of the pixel shown in FIGS. 13A and 13B, the structures of FIGS. 17A and 17B have a structure in which a reset TFT 1705 and a reset signal line 1712 are added.

Operation of the circuits shown in FIGS. 17A and 17B is explained simply. The operation relating to display of an image is similar to that of a conventional pixel as shown in FIGS. 13A and 13B. The reset TFT 1705 and the reset signal line 1712 are used when forming the above stated non-display periods. The gate voltage applied to the EL driver TFT 1702 in the sustain (turn on) period (the electric potential of the gate electrode of the EL driver TFT 1702 with respect to the source region) is provided in accordance with an electric charge stored by a storage capacitor 1704. Namely, the gate voltage applied to the EL driver TFT 1702 (the electric potential of the gate electrode of the EL driver TFT 1702 with respect to the source region) is equal to the electric potential difference between both terminals of the storage capacitor 1704. A reset signal is inputted to the reset signal line 1712 to make the reset TFT 1705 in a conducting state in order to form the non-display period after the completion of the sustain (turn on) period. The electric potential difference between the source region and the drain region of the reset TFT 1705, namely the electric potential difference between both the terminals of the storage capacitor 1704, becomes 0 V by this operation. The voltage between the gate and the source of the EL driver TFT 1702 therefore becomes 0 V and a non-conducting state is entered. Electric current supply to an EL element 1703 is cut off. The reset TFT 1705 immediately returns to a non-conducting state, but the electric potential difference between both the terminals of the storage capacitor 1704 is maintained as is at 0 V, and therefore the voltage between the gate and the source of the EL driver TFT 1702 also remains at 0 V. The EL element 1703 does not turn on until a new image signal is next written in. The non-display period has at least a length which is found by the equation tr=ta−(ts+tg), where the length of the address (write in) period is taken as ta, the length of the sustain (turn on) period is taken as ts, the length of one gate signal line selection period is taken as tg (with ta, ts, tg>0), and the length of the non-display period is taken as tr (where tr>0). The overlap of the address (write in) periods sandwiching a short sustain (turn on) period can thus be avoided.

However, when using a pixel like that shown in FIGS. 17A and 17B, problems such as the following exist.

As stated above, it is preferable to use a p-channel TFT for the EL driver TFT 1702. The threshold voltage is normally negative when using a p-channel TFT. Consequently, almost no drain current flows when the voltage between the gate and the source of the EL driver TFT 1702 is equal to or greater than 0 V. However, a drain current flows in the EL driver TFT 1702 when passing through the sustain (turn on) period, and therefore this is a condition in which deterioration occurs easily when compared to other TFTs. There are cases in which this varying deterioration and manufacturing irregularities become causes for a shift of the threshold voltage to a positive number. In that case, the drain current flows even if the voltage between the gate and the source is 0 V.

Consider, with reference to FIGS. 17A and 17B, a case in which the threshold voltage of the EL driver TFT 1702 is actually shifted to a positive value. Further, description is given with respect to the period in which a signal is normally written in. When a signal is inputted from a source signal line 1707 and black display (the EL element 1703 does not turn on) is performed, the voltage between the gate and the source of the EL driver TFT 1702 certainly becomes a positive value and the drain current does not flow, provided that the electric potential of the signal inputted from the source signal line 1707 is sufficiently higher than the electric potential of an electric current supply line 1708. In other words, by controlling the signal inputted form the outside, normal operation becomes possible even for cases in which TFTs having irregularities such as stated above are included.

On the other hand, with the operation in the non-display period in which the reset TFT 175 is made conductive and the electric current supply to the EL element 1703 is cutoff, the electric potential of the source signal line 1707 and the electric potential of the electric current supply line 1708 become equal in accordance with the reset TFT 1705. The voltage between the gate and the source of the EL driver TFT 1702 becomes 0 V at this time, and a drain current flows if the threshold voltage is shifted to a positive value, and the EL element 1703 emits light. This cannot be handled even if the electric potential of each signal line is changed.

SUMMARY OF THE INVENTION

An object of the present invention is therefore to provide a novel method of driving, in which a high duty ratio is maintained in an electronic device performing driving as stated above, which is capable of normally performing display of an image even for cases having a sustain (turn on) period shorter than the above stated minimum unit, and which is capable of handling cases in which problems such as the above stated shift in the threshold value develop.

Further, when the term development of a shift in the threshold value of the TFT, or the term characteristic irregularity, are used throughout this specification, they indicate that the TFT characteristics are normally on (the TFT is in a conducting state when the electric potential difference between the gate electrode and the source region of the TFT is 0 V).

The following means are stated in the present invention in order to solve the above problems.

One of a source region and a drain region of a reset TFT 105 is electrically connected to an electric current supply line 108, and the other is electrically connected to a gate signal line 106. Further, a TFT having the same polarity as that of an EL driver TFT is used for a switching TFT 101.

The voltage between a gate and a source of an EL driver TFT 102 in the state that the reset TFT 105 is made conductive can be controlled by changing the electric potential of the gate signal line 106 with the present invention. In accordance with this type of method, even if the threshold voltage of the EL driver TFT 102 is shifted, becoming a normally ON state, the EL driver TFT 102 can be placed in a non-conductive state with certainty by changing the electric potential of the gate signal line 106. It therefore becomes possible to make it difficult for electric current to flow in an EL element 103.

Structures of an electronic device of the present invention are stated below.

According to a first aspect of the present invention, there is provided an electronic device comprising: a source signal line driver circuit; a gate signal line driver circuit; a reset signal line driver circuit; and a pixel portion;

characterized in that:
the pixel portion has: a plurality of source signal lines; a plurality of gate signal lines; a plurality of electric current supply lines; a plurality of reset lines; and a plurality of pixels;
each of the plurality of pixels has: a switching transistor; an EL driver transistor; a reset transistor; a storage capacitor, and an EL element;
a gate electrode of the switching transistor is electrically connected to one of the plurality of gate signal lines;
one of a source region and a drain region of the switching transistor is electrically connected to the source signal line, and the remaining one of the source region and the drain region is electrically connected to a gate electrode of the EL driver transistor;
a gate electrode of the reset transistor is electrically connected to the reset signal line;
one of a source region and a drain region of the reset transistor is electrically connected to one of the plurality of gate signal lines, and the remaining one of the source region and the drain region is electrically connected to a gate electrode of the EL driver transistor;
one electrode of the storage capacitor is electrically connected to the electric current supply line, and the remaining electrode is electrically connected to the gate electrode of the EL driver transistor; and
one of a source region and a drain region of the EL driver transistor is electrically connected to the electric current supply line, and the remaining one of the source region and the drain region is electrically connected to one electrode of the EL element.

According to a second aspect of the present invention, in the first aspect of the present invention, there is provided the electronic device, characterized in that:
a p-channel polarity transistor is used for the switching transistor when the source region or the drain region of the EL driver transistor is electrically connected to an anode of the EL element; and
an n-channel polarity transistor is used for the switching transistor when the source region or the drain region of the EL driver transistor is electrically connected to a cathode of the EL element.

According to a third aspect of the present invention, there is provided a method of driving an electronic device, characterized in that:
one frame period has n subframe periods $SF_1, SF_2, \ldots, SF_n$;
the n subframe periods each have address (write in) periods $Ta_1, Ta_2, \ldots, Ta_n$, and sustain (turn on) periods $Ts_1, Ts_2, \ldots, Ts_n$;
the address (write in) period and the sustain (turn on) period overlap in at least one subframe period among the n subframe periods; and
when the address (write in) period $Ta_m$ (where $1 \leq m \leq n$) of the subframe period $SF_m$, and the address (write in) period $Ta_{m+1}$ of the subframe period $SF_{m+1}$ overlap, a non-display period exists in a period from the completion of the sustain (turn on) period $SF_m$ of the subframe period $SF_m$, until the start of the address (write in) period $Ta_{m+1}$.

According to a fourth aspect of the present invention, there is provided a method of driving an electronic device, characterized in that:
one frame period has n subframe periods $SF_1, SF_2, \ldots, SF_n$;
the n subframe periods each have address (write in) periods $Ta_1, Ta_2, \ldots, Ta_n$, and sustain (turn on) periods $Ts_1, Ts_2, \ldots, Ts_n$;
the address (write in) period and the sustain (turn on) period overlap in at least one subframe period among the n subframe periods; and
when the address (write in) period $Ta_n$ of the subframe period $SF_n$ of the number j frame (where $0<j$), and the address (write in) period $Ta_1$ of the subframe period $SF_1$ of the number j+1 frame overlap, a non-display period exists in a period from the completion of the sustain (turn on) period $Ts_n$ of the subframe period $SF_n$ of the number j frame, until the start of the address (write in) period $Ta_1$ of the subframe period SF of the number j+1 frame.

According to a fifth aspect of the present invention, there is provided a method of driving an electronic device, characterized in that:

one frame period has n subframe periods $SF_1$, $SF_2$, ..., $SF_n$;

the n subframe periods each have address (write in) periods $Ta_1$, $Ta_2$, ..., $Ta_n$, and sustain (turn on) periods $Ts_1$, $Ts_2$, ..., $Ts_n$; and if $ta_k > ts_k + tg$ is satisfied in a certain subframe period $SF_k$ ($1 \leq k \leq n$), where the length of the address (write in) period is taken as $ta_k$, the length of the sustain (turn on) period is taken as $ts_k$ and the length of one gate signal line selection period is taken as tg, and $ta_k$, $ts_k$, $tg > 0$, and if the length of a non-display period of $SF_k$ is taken as $tr_k$ (where $tr_k > 0$):

$tr_k \geq ta_k - (ts_k + tg)$ is always satisfied.

According to a sixth aspect of the present invention, in any of the third to fifth aspects of the present invention, there is provided the method of driving an electronic device, characterized in that:

the EL driver transistor is placed in a non-conductive state in the non-display period by the reset transistor being conductive due to a signal input from a reset signal line driver circuit; and during a period after the reset transistor returns to a non-conducting state, until write in of the next signal from the source signal line is preformed, the gate voltage of the EL driver transistor is maintained by the storage capacitor.

According to a seventh aspect of the present invention, in any of the third to sixth aspects of the present invention, there is provided the method of driving an electronic device, characterized in that the EL element is turned off during the non-display period, irrespective of an image signal.

According to an eighth aspect of the present invention, in any of the third to seventh aspects of the present invention, there is provided the method of driving an electronic device, characterized in that the gate voltage of the EL driver transistor in the non-display period is determined by the difference between the electric potential of the electric current supply line and the electric potential of a certain gate signal lire in a non-selected state.

According to a ninth aspect of the present invention, in any of the third to eighth aspects of the present invention, there is provided the method of driving an electronic device, characterized in that an electric potential lower than the threshold voltage of the EL driver transistor, with respect to the electric potential of the electric current supply line, is inputted to the gate signal line in a non-selected state for a case in which the EL driver transistor has n-channel polarity.

According to a tenth aspect of the present invention, in any of the third to eighth aspects of the present invention, there is provided the method of driving an electronic device, characterized in that an electric potential higher than the threshold voltage of the EL driver transistor, with respect to the electric potential of the electric current supply line, is inputted to the gate signal line in a non-selected state for a case in which the EL driver transistor has p-channel polarity.

BRIEF DESCRIPTION OF THE DRAWINGS

In the accompanying drawings:

FIGS. 6A to 6C are diagrams showing an example of a process of manufacturing an electronic device according to Embodiment 2;

FIGS. 7A to 7C are diagrams showing an example of the process of manufacturing the electronic device according to Embodiment 2;

FIGS. 8A and 8B are diagrams showing an example of the process of manufacturing the electronic device according to Embodiment 2;

FIGS. 15A and 15B are diagrams showing timing charts for explaining frame period division in time gray scaling;

DETAILED DESCRIPTION OF THE PREFERRED EMBODIMENTS

Embodiment mode of the present invention is discussed below.

Figure 17A:
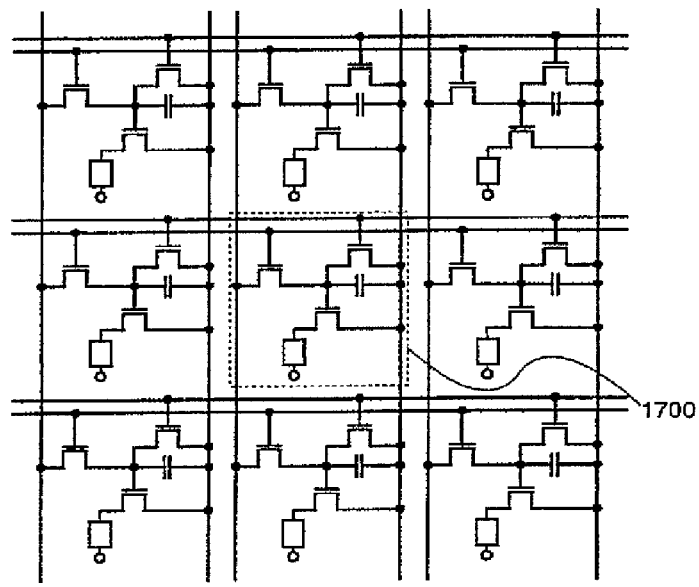
FIGS. 17A and 17B are diagrams showing the structure of the pixel recorded in Japanese Patent Application No. Hei 11-338786.
Figure 17B:
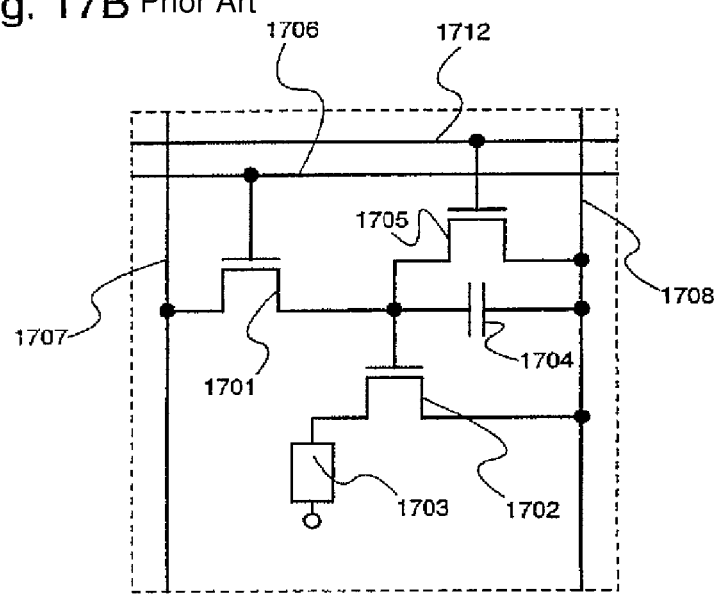

The pixel recorded in Japanese Patent Application No. Hie 11-338786 is one in which one of the source region and the drain region of the reset TFT 1705 is electrically connected to the electric current supply line 1708, and the other is electrically connected to a gate electrode of the EL driver TFT 1702, as shown in FIGS. 17A and 17B. The gate electrode of the reset TFT 1705 is electrically connected to the reset signal line 1712.

Figure 1A:
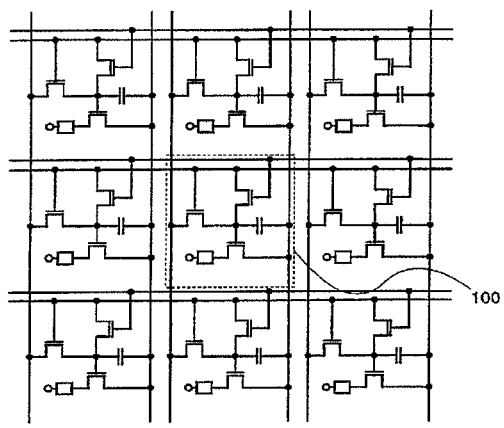
FIGS. 1A and 1B are diagrams showing circuit structures of an electronic device of the present invention.
Figure 1B:
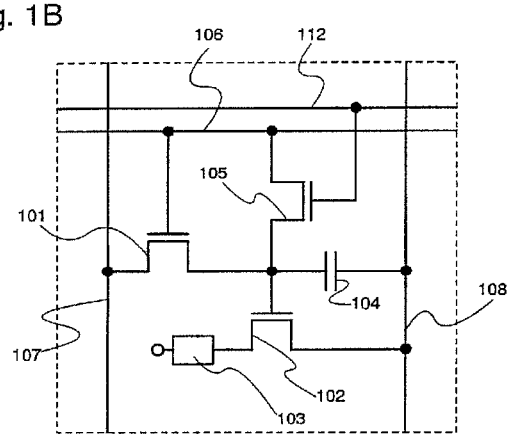

A pixel of the present invention is one in which one of the source region and the drain region of a reset TFT 105 is electrically connected to an electric current supply line 108, while the other is electrically connected to a gate signal line 106, as shown in FIGS. 1A and 1B.

Figure 2A:
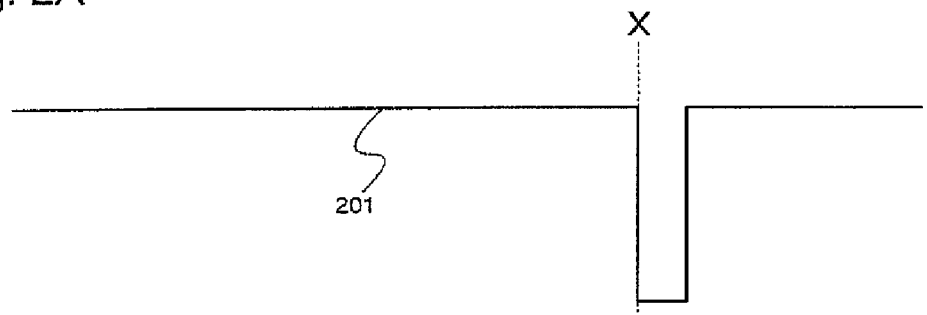
FIGS. 2A to 2C are diagrams showing the relationship among electric potentials of respective portions in a pixel portion.
Figure 2B:
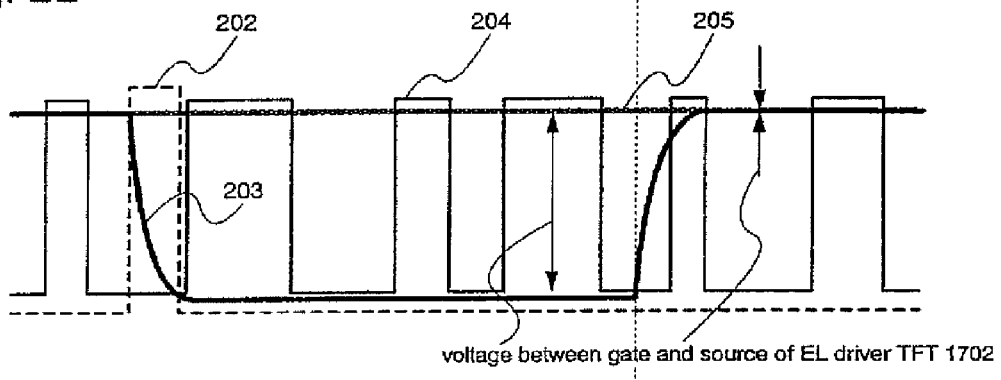
Figure 2C:
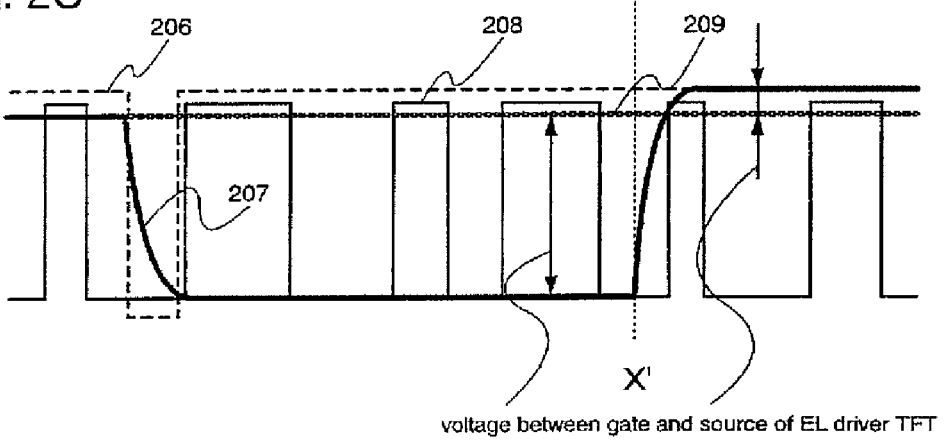

Electric potential patterns in each wiring are explained next, with reference to FIGS. 2A to 2C. FIG. 2A shows the electric potential of a reset signal line, and FIG. 2B shows the electric potential of each wiring for a case of performing drive involving non-display periods using the pixel recorded in Japanese Patent Application No. Hei 11-338786 and shown in FIGS. 17A and 17B. FIG. 2C shows the electric potential of each wiring for a case of performing drive involving non-display periods using a pixel having the structure of the present invention. The case of FIG. 2B is explained first. Note that in order to clearly show the electric potential of each portion, the explanation is made with an n-channel TFT used for the switching TFT and with p-channel TFTs used for the EL driver TFT and for the reset TFT.

A signal waveform 201 shown in FIG. 2A is for a case of using a p-channel TFT for the reset TFT 1705, and the reset TFT 1705 is placed in a conducting state when the electric potential drops. The waveform 201 of FIG. 2A becomes the inverse if an n-channel TFT is used in the reset TFT 1705.

An electric potential 202 of the gate signal line 1706 is discussed next. An n-channel TFT is used for the switching TFT 1701 in the case of FIG. 2B. The electric potential therefore increases when the gate signal line 1706 is selected, and the switching TFT 1701 is placed in a conducting state.

An electric potential 204 of the source signal line 1707 is inputted to the EL driver TFT 1702 and the storage capacitor 1704 via the switching TFT 1701.

An electric potential 203 of the gate electrode of the EL driver TFT 1702 becomes equal to the electric potential 204 of the source signal line 1707 when the switching TFT 1701 is in a conducting state. At the point where the switching TFT 1701 is placed in a conducting state in FIGS. 2A to 2C, the electric potential 204 of the source signal line 1707 is a LO signal, and therefore the electric potential 203 of the gate electrode of the EL driver TFT 1702 drops. The absolute value of the voltage between the gate and the source of the EL driver TFT 1702 becomes larger at this point, and the EL driver TFT 1702 is placed in a conducting state. Electric current therefore flows in the EL element 1703, and the EL element 1703 turns on. If the electric potential 204 of the source signal line 1707 is HI, then the EL element 1703 does not turn on.

A LO signal is then inputted to the reset signal line 1712 at a timinag shown by the dashed line X-X' in FIGS. 2A to 2C, and the reset TFT 1705 is placed in a conducting state. The electric potential 203 of the gate electrode of the EL driver TFT 1702 becomes equal to an electric potential 205 of the electric current supply line 1708 by this operation, and the gate voltage of the EL driver TFT 1702 (the electric potential of the gate electrode with respect to the source region of the EL driver TFT 1702) becomes 0 V. In other words, when the threshold voltage of the EL driver TFT 1702 is shifted to a positive value, it is placed in a conducting state at the point when the gate voltage of the EL driver TFT 1702 (the electric potential of the gate electrode with respect to the source region of the EL driver TFT 1702) becomes 0 V, and electric current flows in the EL element 1703 also during the non-display period. The non-display period cannot be formed normally here.

The case of FIG. 2C is explained next. In this case, the electric potentials of respective portions are explained assuming that p-channel TFTs are used for the switching TFT, the EL driver TFT, and the reset TFT.

First, an electric potential 206 of the gate signal line 106 is explained. As discussed above, a p-channel TFT is used for the switching TFT 101, and therefore the electric potential drops when the gate signal line 106 is selected, and the switching TFT 101 is placed in a conducting state.

An electric potential 208 of the source signal line 107 is inputted to the EL driver TFT 102 and to the storage capacitor 104 via the switching TFT 101.

An electric potential 207 of the gate electrode of the EL driver TFT 103 becomes equal to the electric potential 208 of the source signal line 107 when the switching TFT 101 is in a conducting state. In FIGS. 2A to 2C, the electric potential 208 of the source signal line 107 is a LO signal at the point where the switching TFT 101 is placed in a conducting state, and therefore the electric potential 207 of the gate electrode of the EL driver TFT 102 drops. The absolute value of the voltage between the gate and the source of the EL driver TFT 102 becomes larger at this point, and the EL driver TFT 102 is placed in a conducting state. Electric current consequently flows in the EL element 103, and the EL element 103 turns on. The EL element 103 does not turn on for a case in which the electric potential 208 of the source signal line 107 is a HI signal.

A LO signal is then inputted to the reset signal line 112 at a timing shown by the dashed line X-X' in FIGS. 2A to 2C, and the reset TFT 105 is placed in a conducting state. The electric potential 207 of the gate electrode of the EL driver TFT 102 becomes equal to the electric potential 206 of the gate signal line 106 at this point. For a case in which the EL driver TFT is normally on, the voltage between the gate and the source may be set to a positive value (when a p-channel TFT is used), and may be set so as to turn off with certainty. The voltage between the gate and the source of the EL driver TFT 102 can therefore take on a positive value by making the electric potential 206 of the gate signal line 106 higher corresponding to the amount of shift in the threshold value of the EL driver TFT 102. Electric current can therefore be prevented from flowing even if the threshold value of the EL driver TFT 102 shifts to a positive value, differing from the case of FIG. 2B.

After the reset TFT 105 returns to a non-conducting state, the voltage between the gate and the source of the EL driver TFT 102 at that point is stored by the storage capacitor 104, and therefore the EL element 103 continues in an OFF state in the next subframe period until write in of a signal to the pixel is performed.

The relationship between the polarity of the TFTs structuring the pixels and the electric potential of each portion is explained next.

1) Using an n-Channel TFT for the EL Driver TFT:

It is necessary to make the voltage $V_{GS}$ between the gate and the source of the EL driver TFT 102 higher than the threshold voltage so that the EL driver TFT 102 will be placed in a non-conducting state with certainty in the non-display period. The gate electric potential of the EL driver TFT 102 becomes the electric potential $V_G$ 206 of the gate signal line 106, and the source electric potential becomes the electric potential $V_{CUL}$ 209 of the electric current supply line 108 at this point because the reset TFT 105 is made conductive. If the EL driver TFT 102 is normally on, then at least $V_G$ 206 $>V_{CUL}$

209 must be true. The electric potential $V_G$ of the gate signal line 106 arbitrarily changes along with deterioration of the EL driver TFT 102, but in this case $V_G$ changes in the direction of becoming higher as deterioration proceeds. Therefore, in order to place the switching TFT 101 in a non-conducting state for all cases, even if the gate electric potential of the switching TFT 101, namely the electric potential $V_G$ of the gate signal line 106, takes a high value, the switching TFT 101 must always be in a non-conducting state. It is thus preferable to use a p-channel TFT for the switching TFT 101.

2) Using a p-Channel TFT for the EL Driver TFT:

It is necessary to make the voltage $V_{GS}$ between the gate and the source of the EL driver TFT 102 higher than the threshold voltage so that the EL driver TFT 102 will be placed in a non-conducting state with certainty in the non-display period. The gate electric potential of the EL driver TFT 102 becomes the electric potential $V_G$ of the gate signal line 106, and the source electric potential becomes the electric potential $V_{CUL}$ of the electric current supply line 108 at this point because the reset TFT 105 is made conductive. If the EL driver TFT 102 is normally on, then at least $V_G > V_{CUL}$ must be true. The electric potential $V_G$ of the gate signal line 106 arbitrarily changes along with deterioration of the EL driver TFT 102, but in this case $V_G$ changes in the direction of becoming higher as deterioration proceeds. Therefore, in order to place the switching TFT 101 in a non-conducting state for all cases, even if the gate electric potential of the switching TFT 101, namely the electric potential $V_G$ of the gate signal line 106, takes a high value, the switching TFT 101 must always be in a non-conducting state. It is thus preferable to use a p-channel TFT for the switching TFT 101.

Note that the polarity of the reset TFT 105 is not particularly of concern, but considering the voltage between the source and the drain of the reset TFT 105, it is preferable to use an n-channel TFT for the first case above, and it is preferable to use a p-channel TFT for the second case above.

Note also that, although one of the source region and the drain region of the reset TFT 105, and the gate electrode of the switching TFT 101, are both electrically connected to the same gate signal line 106 in FIGS. 1A and 1B, one of the source region and the drain region of the reset TFT 105, may also be connected to any gate signal line, not only the gate signal line 106 within FIGS. 1A and 1B.

Further, although a case of a driving method which combines a time gray scale method and a digital gray scale method is discussed in the embodiment mode, the essence of the present invention, the arrangement of the reset TFT, can also be applied to other methods of driving. It can also be applied, of course, to a driving method in which a surface area gray scale method and a digital gray scale method are combined, and to a method of driving in which a surface area gray scale method, a digital gray scale method, and a time gray scale method are combined.

Embodiments of the present invention are described below.

[Embodiment 1]

Figure 3A:
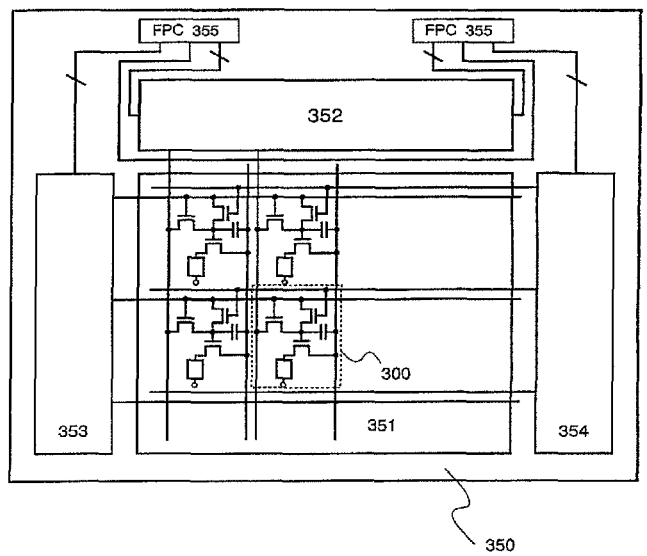
FIGS. 3A and 3B are diagrams showing examples of circuit structures using the pixel of the present invention according to Embodiment 1.
Figure 3B:
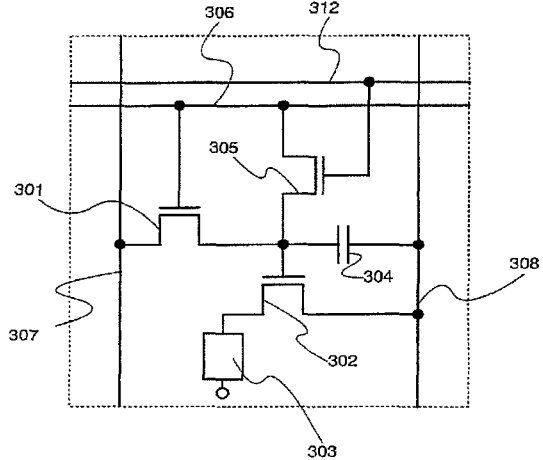

FIG. 3A is an example of an entire circuit structure of an electronic device shown by Embodiment 1. A pixel portion 351 is arranged in the center of a substrate 350. A source signal line driver circuit 352 is arranged on the top side of the pixel portion 351 in order to control source signal lines. To the left side of the pixel portion 351 is arranged a gate signal line driver circuit 353 in order to control gate signal lines. A reset signal line driver circuit 354 is arranged on the right side of the pixel portion 351 in order to control reset signal lines. A portion surrounded by a dotted line frame 300 in the pixel portion 351 is one pixel portion circuit, and an enlargement diagram is shown in FIG. 3B. The names of respective portions of FIG. 3B are similar to those of FIG. 1B, and therefore are omitted here.

Actual driving is discussed next. In Embodiment 1, k-bit ($2^k$) gray scales are expressed by a method in which digital gray scales and time gray scales are combined. For simplicity of explanation, an example of a case in which 3-bit gray scale expression is performed, with k=3, is explained. The circuit shown in FIGS. 3A and 3B is referenced.

Figure 4A:
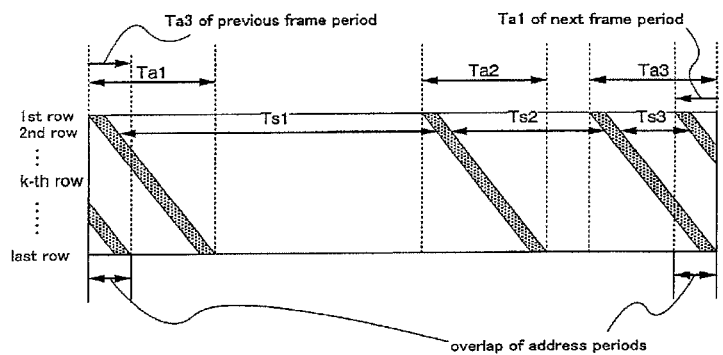
FIGS. 4A and 4B are diagrams showing timing charts relating to a method of driving according to Embodiment 1.
Figure 4B:
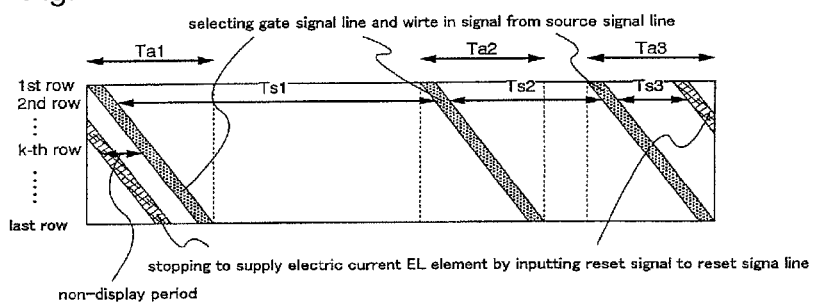

Timing charts for the 3-bit gray scale expression explained in Embodiment 1 are shown in FIGS. 4A and 4B. One frame period is divided into three subframe periods $SF_1$ to $SF_3$, and the subframe periods have address (write in) periods $Ta_1$ to $Ta_3$ and sustain (turn on) periods $Ts_1$ to $Ts_3$, respectively. The lengths of the sustain (turn on) periods are set so as to be powers of 2, and for FIGS. 4A and 4B, this becomes $Ts_1:Ts_2:Ts_3 = 2^2:2^1:2^0$.

Further, the address (write in) periods are periods from the selection of the first row gate signal line until the completion of selection of the last row gate signal line, and therefore $Ta_1$ to $Ta_3$ all have equal lengths.

The sustain (torn on) period $Ts_3$ of the least significant bit portion is shorter than the address (write in) period $Ta_3$. Therefore, as shown in FIG. 4A, if there is a transition to the address (write in) period $Ta_1$ of the next frame period immediately after the completion of the sustain (turn on) period $Ts_3$, a period develops in which the address (write in) periods of differing subframe periods overlap. Selection of a plurality of gate signal lines is performed simultaneously in this period, and therefore normal image display cannot be performed.

Figure 5:
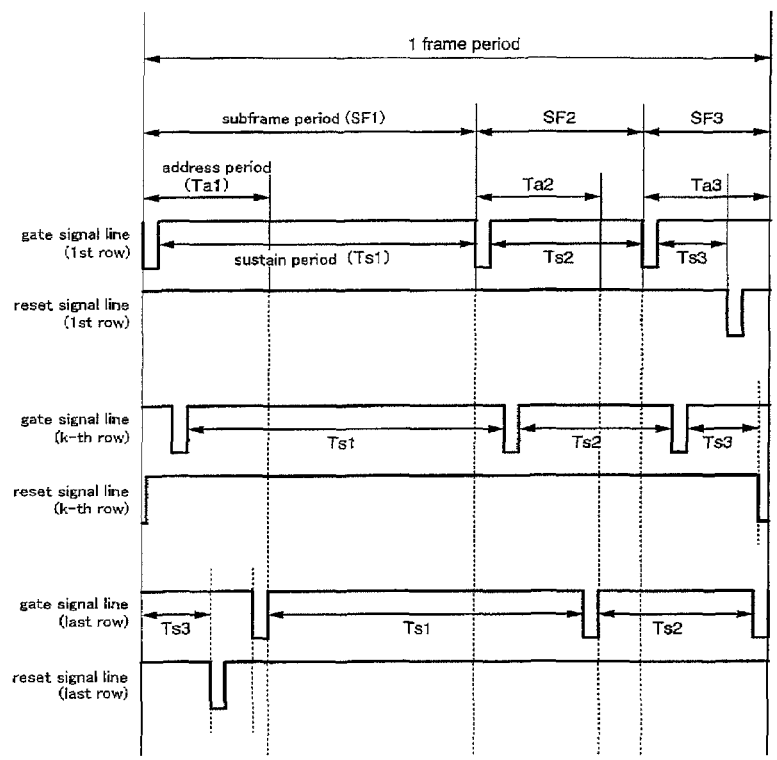
FIG. 5 is a diagram showing a timing chart of a gate signal line and a reset signal line in the method of driving according to Embodiment 1.

A signal is inputted to a reset signal line 312 after the completion of the sustain (turn on) period $Ta_3$, as shown in FIG. 4B, an EL element 303 is turned off, and a non-display period is formed in a period until the start of the next address (write in) period. The electric potential of a gate signal line 306 and the reset signal line 312 in a certain frame period are shown in FIG. 5. A p-channel TFT is used as a reset TFT 305 in Embodiment 1, and therefore the reset TFT 305 is placed in a conducting state when the electric potential of the reset signal line 312 is low. An n-channel TFT may also be used as the reset TFT 305.

First, the gate signal line 306 is selected in the subframe period $SF_1$, and write in of a signal to a pixel from a source signal line 307 is performed. When signal write in to pixels is completed for each row, the sustain (turn on) period $Ts_1$ immediately begins. This operation is performed from the first row until the last row. The gate signal line 306 is then similarly selected in the subframe period $SF_2$, and write in of a signal to a pixel from the source signal line 307 is performed. The sustain (turn on) period $Ts_2$ immediately begins when signal write in to the pixels is completed for each row. This operation is performed from the first row until the last row.

In the subframe period $SF_3$, first the gate signal line 306 is selected, similar to $SF_1$ and $SF_2$, and write in of a signal to a pixel is performed. After signal write in to the pixel is completed for each row, the sustain (turn on) period $Ts_3$ immediately begins. This operation is performed from the first row until the last row. The sustain (turn on) period $Ts_3$ is shorter than the address (write in) period $Ta_3$ at this point, and consequently, before the completion of the address (write in) period $Ta_3$, namely before the completion of the period for selecting the gate signal line of the final row, the sustain (turn on) period $Ts_3$ of the first row is completed. Immediately after the sustain (turn on) period $Ts_3$ of the first row is completed, a reset signal is inputted to the reset signal line of the first row, the reset TFT 305 is placed in a conducting state, and the electric potential difference between both electrodes of a storage capacitor 304, namely the voltage between the gate and the source of the EL driver TFT 302, becomes equal to the electric potential difference between the gate signal line 306 and an electric current supply line 308. The EL driver TFT 302 therefore is placed in a non-conducting state, and the supply of electric current to the EL element 303 is cutoff. The voltage between the gate and the source of the EL driver TFT 302 at this point is stored by the storage capacitor 304 even after the reset TFT 305 returns to a non-conducting state. The EL element 303 therefore continues in a turned OFF state in the next subframe period until write in of a signal to the pixel is performed.

The electric potential of the gate signal line 306 in a non-selected state need to be raised in a case where the threshold voltage of the EL driver TFT 302 is shifted to a positive value. By doing so, the electric potential difference between both electrodes of the storage capacitor 304, namely the gate voltage of the EL driver TFT 302 (the electric potential of the gate electrode with respect to the source region of the EL driver TFT 302) can be arbitrarily controlled.

In accordance with the method of driving shown in Embodiment 1, it is possible to freely set the length of the sustain (turn on) period by changing the timing at which the reset signal is input. It is possible to perform normal display of an image even in a subframe period having a sustain (turn on) period shorter than the minimum unit in the display method which combines normal digital gray scales and time gray scales.

Further, even if the EL driver TFT 302 is normally on, it is possible to handle this by changing the electric potential of the gate signal line 306 in a non-selected state.

[Embodiment 2]

In Embodiment 2, a detailed description will be made of a method of simultaneously manufacturing, on the same substrate, a pixel portion and a driver circuit TFT (N-channel type and P-channel type) formed in the periphery of the pixel portion is explained.

First, as shown in FIG. 6A, a base film 5002 made of an insulating film such as a silicon oxide film, a silicon nitride film or a silicon oxynitride film is formed on a substrate 5001 made from glass such as a barium borosilicate glass or an alumino borosilicate glass, typically #7059 glass or #1737 glass of Corning Corp. For example, a silicon oxynitride film 5002a formed from $SiH_4$, $NH_3$, $N_2O$ by a plasma CVD method with a thickness of 10 to 200 nm (preferably 50 to 100 nm), and a silicon oxynitride hydride film 5002b formed from $SiH_4$ and $N_2O$, similarly, with a thickness of 50 to 200 m (preferably 100 to 150 nm) are laminated. In Embodiment 2, the base film 5002 is shown as a two-layer structure, but a single layer or a lamination of two or more layers of the insulating film may be adopted to form the base film 5002.

Island-shape semiconductor layers 5003 to 5006 are formed of a crystalline semiconductor film obtained by crystallizing a semiconductor film having an amorphous structure with a laser crystallization method or a thermal crystallization method. The island-shape semiconductor layers 5003 to 5006 are given a thickness of from 25 to 80 nm (preferably 30 to 60 nm). There is no limitation on the material of the crystalline semiconductor film, but silicon or an alloy of silicon germanium (SiGe) is preferably used. To form the crystalline semiconductor film by the laser crystallization method, a pulse oscillation type or continuous emission type excimer laser, a YAG laser, or $YVO_4$ laser is used. In the case where the above laser is used, it is appropriate to use a method in which laser light radiated from a laser oscillator is condensed by an optical system into a linear beam, and is irradiated to a semiconductor film. Although the condition of crystallization should be appropriately selected by an operator, in the case where the excimer laser is used, a pulse oscillation frequency is set to 30 Hz, and a laser energy density is set to 100 to 400 ml/cm² (typically 200 to 300 mJ/cm²). Also, in the case where the YAG laser is used, it is appropriate that the second harmonic is used, a pulse oscillation frequency is set to 1 to 10 kHz, and a laser energy density is set to 300 to 600 mJ/cm² (typically, 350 to 500 mJ/cm²). Then, laser light condensed into a linear shape with a width of 100 to 1000 µm, for example, 400 µm is irradiated to the whole surface of the substrate, and an overlapping ratio (overlap ratio) of the linear laser light at this time is set to 80 to 98%.

Next, a gate insulating film 5007 is formed, which covers the island-shape semiconductor layers 5003 to 5006. The gate insulating film 5007 is formed of an insulating film containing silicon with a thickness of from 40 to 150 nm by using plasma CVD or sputtering. In Embodiment Z the gate insulating film 5007 is formed of an oxynitride silicon film with a thickness of 120 nm. Of course, the gate insulating film is not limited to such an oxynitride silicon film, and another insulating film containing silicon may be used as a single-layer structure or a lamination structure. For example, in the case where a silicon oxide film is used, TEOS (tetraethyl orthosilicate) and $O_2$ are mixed with each other by the plasma CVD method, with reaction pressure of 40 Pa, a substrate temperature of 300 to 400° C., and discharge is made at a high frequency (13.56 MHz) with a power density of 0.5 to 0.8 W/cm², to form the film. Then, the silicon oxide film thus formed is subjected to thermal annealing at 400 to 500° C. to obtain excellent characteristics as the gate insulating film.

Then, a first conductive film 5008 and a second conductive film 5009, for forming a gate electrode on the gate insulating film 5007, are formed. In Embodiment 2, the first conductive film 5008 is formed of a Ta film with a thickness of 50 to 100 nm, and the second conductive film 5009 is formed of a W film with a thickness of 100 to 300 nm.

The Ta film is formed by sputtering with Ar using Ta as a target. In this case, when a suitable amount of Xe or Kr is added to Ar for sputtering, it is possible to relieve internal stress of the Ta film, thereby being capable of preventing the film from peeling off. The resistivity of an α-phase Ta film is on the order of 20 µΩcm and the film can be used as the gate electrode. However, the resistivity of a β-phase Ta film is on the order of 180 µΩcm, and the film is not suitable for the gate electrode. To form the α-phase Ta film, if tantalum nitride having crystalline structure close to the α-phase of Ta is formed to a thickness of on the order of 10 to 50 nm as a base of Ta, the α-phase Ta film can be easily obtained.

The W film is formed by sputtering with a W target. In addition, the W film can be formed by thermal CVD using tungsten hexafluoride ($WF_6$). Whichever method is used, it is necessary to make the material have low resistance for use as the gate electrode. It is preferable that the resistivity of the W film is set as 20 µΩcm or lower. By making the crystal grains large, it is possible to make the W film have lower resistivity. However, for cases where there are many impurity elements such as oxygen within the W film, crystallization is inhibited and the resistance becomes higher. Therefore, by forming the W film using a W target having a purity of 99.9999%, and further, taking sufficient consideration so that there is no mixing in of impurities from the inside of the gas phase during film formation, resistivity of 9 to 20 µΩcm can be realized.

Note that, in Embodiment 2, although the Ta film and the W film are used for the first conductive film 5008 and the second conductive film 5009, respectively, there is no limitation on the material for the conductive films. The first conductive film 5008 and the second conductive film 5009 may be formed from an element selected from the group consisting of Ta, W, Ti, Mo, Al, and Cu, or an alloy material or compound material containing as a main component the above element. Also, a semiconductor film typified with a polycrystalline silicon film into which an impurity such as phosphorous is doped may be used. Examples of the other combinations preferably include: a combination in which the first conductive film is formed from tantalum nitride (TaN) and the second conductive film is formed from W; a combination in which the first conductive film is formed from tantalum nitride (TaN) and the second conductive film is formed from Al; and a combination in which the first conductive film is formed from tantalum nitride (TaN) and the second conductive film is formed from Cu.

Then, a mask 5010 is formed from resist, and a first etching process for forming electrodes and wirings is performed. In Embodiment 2, an ICP (inductively coupled plasma) etching method is used, and the etching is performed using a mixture of $CF_4$ and $Cl_2$ as etching gasses, and a 500 W RF (13.56 MHz) power is inputted to a coil type electrode at a pressure of 1 Pa to generate plasma. A 100 W RF (13.56 MHz) power is inputted to the substrate side (sample stage) as well, substantially applying a negative self bias voltage. When $CF_4$ and $Cl_2$ are mixed together, the W film and the Ta film can be etched at approximately the same rate.

Under the above-mentioned conditions, the shape of the mask consisting of resist is made into an appropriate one, with the result that edge portions of the first conductive film and the second conductive film are made into a tapered shape by the effect of a biasing voltage applied to the substrate side. The angle of the tapered portion is set from 15 to 45'. In order to etch without any residue remaining on the gate insulating film, the etching time is preferably increased by a ratio on the order of 10 to 20%. The selectivity of the oxynitride silicon film is 2 to 4 (typically 3) with respect to the W film, and therefore the oxynitride silicon film is etched on the exposed surface by approximately 20 to 50 nm due to an over-etching process. First shape conductive layers 5011 to 5016 (first conductive layers 5011a to 5016a and second conductive layers 5011b to 5016b) are thus formed from the first conductive film and the second conductive film by the first etching process. At this time, in the gate insulating film 5007, regions which are not covered with the first shape conductive layers 5011 to 5016 are etched by about 20 to 50 nm so that thinned regions are formed (FIG. 6A).

Then, a first doping treatment is carried out to add an impurity element imparting an n-type (FIG. 6B). Doping may be carried out by ion doping or ion injecting. The condition of the ion doping method is such that a dosage is $1 \times 10^{13}$ to $5 \times 10^{14}$ atoms/cm$^2$, and an acceleration voltage is 60 to 100 keV. As the impurity element imparting the n-type, an element belonging to group 15, typically phosphorus (P) or arsenic (As) may be used. Phosphorus (P) is used here. In this case, the conductive layers 5011 to 5015 become the masks to the impurity element imparting the n-type, and first impurity regions 5017 to 5025 are formed in a self aligning manner. An impurity element imparting the n-type in the concentration range of $1 \times 10^{20}$ to $1 \times 10^{21}$ atoms/cm$^3$ is added to the first impurity regions 5017 to 5025.

A second etching process is performed next, as shown in FIG. 6C. The ICP etching method is similarly used, and a mixture of $CF_4$, $Cl_2$, and $O_2$ are used as an etching gas. An RF power (13.56 MHz) of 500 W is applied to a coil type electrode under a pressure of 1 Pa to generate plasma. An RF (13.56 MHz) power of 50 W is applied to the side of the substrate (sample stage) and a low self bias voltage as compared with the first etching treatment is applied. The W film is anisotropically etched in accordance with these conditions, and the Ta film is anisotropically etched at a slower etching rate, forming second shape conductive films 5026 to 5031 (first conductive layers 5026a to 5031a and second conductive layers 5026b to 5031b). Region not covered by the second shape conductive layers 5026 to 5031 are further etched on the order of 20 to 50 nm, so that thinned regions are formed.

An etching reaction of the W film or the Ta film by the mixture gas of $CF_4$ and $C_2$ can be guessed from a generated radical or ion species and the vapor pressure of a reaction product. When the vapor pressures of fluoride and chloride of W and Ta are compared with each other, $WF_6$ of fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by an addition of $O_2$. Since the oxide of Ta does not react with fluorine or chlorine, the etching rate of the Ta film is further decreased. Accordingly, it becomes possible to make a difference between the etching rates of the W film and the Ta film, with the result that it becomes possible to make the etching rate of the W film higher than that of the Ta film.

Then, as shown in FIG. 7A, a second doping treatment is carried out. In this case, a dosage is made lower than that of the first doping treatment and under the condition of a high acceleration voltage, and an impurity element imparting the n-type is doped. For example, an acceleration voltage is made 70 to 120 keV, and the treatment is carried out at a dosage of $1 \times 10^{13}$ atoms/cm$^2$, so that new impurity regions are formed inside the first impurity regions formed into the island-shape semiconductor layers in FIG. 6B. Doping is carried out using as the masks the second shape conductive layers 5026 to 5030 to add the impurity element to the regions under the second conductive layers 5026a and 5030a. In this way, third impurity regions 5032 to 5041 overlapping with the second conductive layers 5026a and 5030a, and second impurity regions 5042 to 5051 between the first impurity regions and the third impurity regions are formed. The concentration of the impurity element imparting the n-type is set so that the concentration of the second impurity regions become $1 \times 10^{17}$ to $1 \times 10^{19}$ atoms/cm$^3$, and the concentration of the third impurity regions become $1 \times 10^{16}$ to $1 \times 10^{15}$ atoms/cm$^3$.

Then, as shown in FIG. 7B, fourth impurity regions 5052 to 5074 are formed, which have a reverse conductivity to that of the first conductivity in an island-like semiconductor layer 5004 to 5006 for forming p-channel TFTs. Second conductive layers 5027b to 5030b are used as masks against impurity element to form the impurity regions in a self aligning manner. At this time, the whole surfaces of the island-like semiconductor layer 5003 forming n-channel TFTs and a wiring portion 5031 are covered with resist masks 5200. Phosphorus is added to the impurity regions 5522 to 5524 at different concentrations, respectively. However, the regions are formed by ion doping using diborane ($B_2H_6$) and the impurity concentration is made $2 \times 10^{20}$ to $2 \times 10^{21}$ atoms/cm$^3$ in any of the regions.

By the steps up to this, the impurity regions are formed in the respective island-like semiconductor layers. The second conductive layers 5026 to 5030 overlapping with the island-like semiconductor layer function as gate electrodes. Also, the wiring portion 5031 functions as an island-like source signal line.

A step of activating the impurity elements added in the respective island-like semiconductor layers for the purpose of controlling the conductivity type in this way, as shown in FIG. 7C, is carried out. This step is carried out by a thermal annealing method using a furnace annealing oven. In addition, a laser annealing method or a rapid thermal annealing method (RTA method) can be applied. The thermal annealing method is carried out in a nitrogen atmosphere having an oxygen concentration of 1 ppm or less, preferably 0.1 ppm or less and at 400 to 700° C., typically 500 to 600° C. In this embodiment, heat treatment at 500° C. for 4 hours is carried out. However, in the case where a wiring material used for the second conductive layers 5026 to 5031 is weak to heat, it is preferable that the activation is carried out after an interlayer insulating film (containing silicon as a main component) is formed to protect the wiring line or the like.

Further, a heat treatment at 300 to 450° C. for 1 to 12 hours is carried out in an atmosphere containing hydrogen of 3 to 100%, so that a step of hydrogenating the island-like semiconductor layers is carried out. This step is a step of terminating dangling bonds in the semiconductor layer by thermally excited hydrogen. As another means for hydrogenation, plasma hydrogenation (using hydrogen excited by plasma) may be carried out.

Then, as shown in FIG. 8A, a first interlayer insulating film 5075 is formed from a silicon oxynitride film into a thickness of 100 to 200 nm. A second interlayer insulating film 5076 formed from an organic insulating material is formed thereon, and thereafter, contact holes are formed in a first interlayer insulating film 5075, a second interlayer insulating fihm 5076, and the gate insulating film 5007. After patterning respective wirings (inclusive of connection wiring and signal wiring) 5077 to 5082, 5084, a pixel electrode contacting the connection wiring 5082 is formed by patterning.

As the second interlayer insulating film 5076, a film made of organic resin is used, and as the organic resin, polyimide, polyamide, acrylic, BCB (benzocyclobutene) or the like can be used. Especially, since the second interlayer insulating film 5076 has rather the mearing of flattening, acrylic excellent in flatness is desirable. In this embodiment, an acrylic film is formed to such a thickness that stepped portions formed by the TFTs can be adequately flattened. It is appropriate that the thickness is preferably made 1 to 5 μm (most preferably 2 to 4 μm).

The formation of the contact holes are performed by dry etching or wet etching. Contact holes reaching the n-type impurity regions 5017 and 5018 or the p-type impurity regions 5052 to 5074, a contact hole reaching to a wiring 5031, a contact hole reaching electric current supply line (not shown), and a contact hole (not shown) reaching a gate electrode are formed, respectively.

Besides, as the wirings (inclusive of connection line and signal line) 5077 to 5082, and 5084, a lamination film of three-layer structure is used, in which a Ti film with a thickness of 100 nm, an aluminum film containing Ti with a thickness of 300 nm, and a Ti film with a thickness of 150 nm are continuously formed by sputtering into one is patterned into a desired shape. Of course, the other conductive film may be used.

Further, in Embodiment 2, an ITO film with a thickness of 110 nm is formed as a pixel electrode 5083, and then subjected to patterning. A contact is obtained by arranging the pixel electrode 5083 so as to overlap with the connection wiring 5082 while contacting therewith. Besides, a transparent conductive film in which 2 to 20% of zinc oxide is mixed with indium oxide may be used. This pixel electrode 5083 becomes an anode of an EL element (FIG. 8A).

Then, as shown in FIG. 8B, an insulating film containing silicon (silicon oxide film in Embodiment 2) is formed into a thickness of 500 nm, and an opening is formed at a position corresponding to the pixel electrode 5083 to form the third interlayer insulating film 5085. Upon the formation of the opening, taper-shape side walls can easily be formed by using a wet etching method. If the side walls of the opening is sufficiently smooth, degradation of the EL layer caused by the step becomes a remarkable problem.

Then, an EL layer 5086 and a cathode (MgAg electrode) 5087 are continuously formed by vapor deposition without exposing them to the atmosphere. Note that the thickness of the EL layer is preferably set as 80 to 200 nm (typically 100 to 120 nm), and the thickness of the cathode 5087 is preferably set as 180 to 300 nm (typically 200 to 250 nm).

In this step, the EL layer and the cathode are sequentially formed with respect to the pixels corresponding to a red color, a green color, and a blue color, respectively. Note that, the EL layer lacks withstand property against solutions, and therefore the respective colors must be formed individually without using a photolithography technology. For that reason, it is preferred that portions other than desired pixels are masked using metallic masks, and the EL layer and the cathode are selectively formed only for the necessary portions.

In other words, a mask for masking all the portions except the pixels corresponding to a red color is first set, and the EL layer emitting a red color and the cathode are selectively formed using the mask. Then, a mask for masking all the portions except the pixels corresponding to a green color is set, and the EL layer emitting a green color and the cathode are selectively formed using the mask. Succeedingly, similarly, a mask for masking all the portions except the pixels corresponding to a blue color is set, and the EL layer emitting a blue color and the cathode are selectively formed using the mask. Note that, in this case, a description is made such that a different mask is used for each case, however, the same mask may be used for all the cases. In addition, it is preferred that the above process steps are performed while maintaining a vacuum state until the EL layers and cathodes are formed with respect to all the pixels.

Employed in this case is a system in which three kinds of EL elements corresponding to RGB are formed. However, the following systems may be used: a system in which an EL element emitting a white color and a color filter are combined; a system in which an EL element emitting a blue or blue-green color and a fluorescing body (fluorescing color conversion layer: CCM) are combined; and a system in which a transparent electrode is used for a cathode (opposing electrode) and an EL element corresponding to the RGB is overlapped therewith.

Note that known materials may be used for the EL layer 5086. As the known materials, organic materials are preferably used when taking a driver voltage into an account. For example, a four-layer structure consisting of a positive hole injection layer, a positive transportation layer, a light emitting layer, and an electron injection layer may be used as the EL layer. Further, in Embodiment 2, an example is shown in which an MgAg electrode is used as the cathode of the EL element, however, the other known material may be used.

Then, a protective electrode 5088 is formed while covering the EL layer and the cathode. A conductive film containing as a main component aluminum may be used for this protective electrode 5088. The protective electrode 5088 may be formed by vapor deposition using a mask different from that used for forming the EL layer and the cathode, Also, it is preferred that the protective electrode 5088 is continuously formed after the formation of the EL layer and the cathode without exposing to the air.

Finally, a passivation film 5089 made from a silicon nitride film is formed into a thickness of 300 nm. The protective film 5088 actually plays a role to protect the EL layer from moisture, etc. However, the reliability of the EL layer may be enhanced by forming the passivation film 5089 in addition thereto.

Thus, an active matrix electronic device having a structure shown in FIG. 8B is completed. Note that, in the manufacturing steps of the active matrix electronic device in accordance with Embodiment 2, a source wiring is formed of Ta or W, which is used for forming the gate electrode, and a gate wiring is formed of Al, which is a wiring material used for forming the source and drain electrodes, on account of the circuit structures and manufacturing steps thereof. However, different material may be used therefor.

Note that, in the active matrix substrate according to Embodiment 2, by providing a TFT having a structure which is most suitable not only to the pixel portion, but also to the driver circuit portion, extremely high reliability can be exhibited and an operational characteristic can be enhanced. Besides, it is possible to enhance the crystallinity by adding a metallic catalyst such as Ni in the crystallization step. As a result, a driving frequency of the source signal line driver circuit can be made 10 MHz or more.

First, in order to prevent the operation speed from lowering as much as possible, a TFT having a structure capable of lowering a hot carrier injection is used as an n-channel TFT of CMOS circuit forming the driver circuit portion. Note that a driver circuit referred to herein includes a shift resistor, a buffer, a level shifter, a latch of a line-sequence driver, a transmission gate of a point-sequence driver, and the like.

In Embodiment 2, the active layer of the n-channel TFT includes the source region, drain region, GOLD region, LDD region, and channel forming region, and the GOLD region is overlapped with the gate electrode via the gate insulating film.

Further, the p-channel TFT of the CMOS circuit does not need to care about the degradation caused by the hot carrier injection, the LDD region may not be particularly provided. Of course, the LDD region may be formed as well as the n-channel TFT to take measures against the hot carrier.

In addition, in the driver circuit, in the case where such a CMOS circuit that current flow bilateral directions in the channel forming region, that is, such the CMOS circuit that the role of the source region and the role of the drain region are changed over is used, the n-channel TFT forming the CMOS circuit may preferably be formed such that the LDD regions are formed on both sides of the channel forming region so as to sandwich the channel forming region. As the examples thereof, there are enumerated the transmission gate, etc., used in the point-sequence driving. Also, in the driver circuit, in the case where such a CMOS circuit that an off current value must be lowered as much as possible is used, the n-channel TFT forming the CMOS circuit is preferably have a structure in which a part of the LDD regions is overlapped with the gate electrode via the gate insulating film. The transmission gate, or the like, which is used for the point-sequence driving, is also given as the examples thereof.

Note that, in an actual case, if the state shown in FIG. 8B is completed, it is preferred that packaging (enclosure) is performed by a protective film (laminate film, ultraviolet ray curing resin film, etc.), which has a high air-tightness, and is less degassing or a transparent sealing material, in order to protect it from exposing to air. At that time, if the inside of the sealing agent is made into an inert atmosphere, or a hygroscopic material (for example, barium oxide) is arranged the inside thereof, the reliability of the EL element enhances.

Besides, if the air-tightness is enhanced by the processes such as packaging, a connector (flexible print circuit: FPC) for connecting the leading terminal and the outside signal terminal is attached thereto, to thereby complete it as a product. In this specification, the electronic device refers to the product, which is completed to the state, which can be shipped.

Further, in accordance with Embodiment 2, the number of photo masks which is necessary for the fabrication of the active matrix substrate can be made into five (island-like semiconductor layer pattern, the first wiring pattern (gate wiring, island-like source wiring, and capacitor wiring), a mask pattern for the n-channel region, a contact hole pattern, and the second wiring patterns (inclusive of pixel electrode and connection electrode). As a result, the manufacturing process may be shorten, and it contributes to the lowering of the manufacturing costs, and the improvement of yields.

[Embodiment 3]

An example of manufacturing an electric device using the present invention is explained in embodiment 3.

Figure 9A:
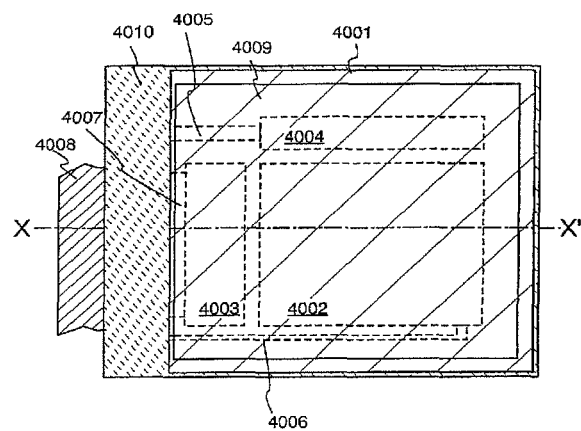
FIGS. 9A and 9B are a top surface diagram and a cross sectional diagram, respectively, of an electronic device according to Embodiment 3.
Figure 9B:
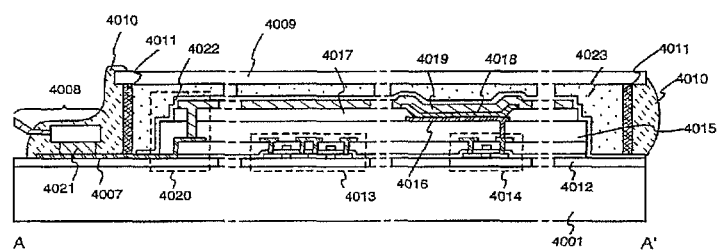

FIG. 9A is a top view of an electric device using the present invention. FIG. 9B illustrates a cross-sectional view taken along the line X-X' in FIG. 9A. In FIG. 9A, reference numeral 4001 is a substrate, reference numeral 4002 is a pixel portion, reference numeral 4003 is a source signal side driver circuit, and reference numeral 4004 is a gate signal side driver circuit. The driver circuits are connected to external equipment, through an FPC 4008, via wirings 4005 to 4007.

A covering material 4009, an airtight sealing material 4010 and a sealing material (also referred to as a housing material) 4011 (shown in FIG. 9B) are formed so as to enclose at least the pixel portion, preferably both the driver circuits and the pixel portion, at this point.

Further, FIG. 9B is a cross sectional structure of the electric device of the present invention. A driver circuit TFT 4013 (note that a CMOS circuit in which an n-channel TFT and a p-channel TFT are combined is shown in the figure here), a pixel portion TFT 4014 (note that only an EL driver TFT for controlling the current flowing to an EL element is shown here) are formed on a base film 4012 on a substrate 4001. The TFTs may be formed using a known structure (a top gate structure or a bottom gate structure).

After the driver circuit TFT 4013 and the pixel portion TFT 4014 are completed, a pixel electrode 4016 is formed on an interlayer insulating film (leveling film) 4015 made from a resin material. The pixel electrode 4016 is formed from a transparent conducting film for electrically connecting to a drain of the pixel portion TFT 4014. An indium oxide and tin oxide compound (referred to as ITO) or an indium oxide and zinc oxide compound can be used as the transparent conducting film. An insulating film 4017 is formed after forming the pixel electrode 4016, and an open portion is formed on the pixel electrode 4016.

An EL layer 4018 is formed next. The EL layer 4018 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the electric device can also be made to emit a single color of light.

After forming the EL layer 4018, a cathode 4019 is formed on the EL layer. It is preferable to remove as much as possible any moisture or oxygen existing in the interface between the cathode 4019 and the EL layer 4018. It is therefore necessary to use a methods of depositing the EL layer 4018 and the cathode 4019 continually under vacuum or forming the EL layer 4018 in an inert gas atmosphere and forming the cathode 4019 without the air exposure. The above film deposition becomes possible in this embodiment by using a multi-chamber method (cluster tool method) film deposition apparatus.

Note that a lamination structure of a LiF (lithium fluoride) film and an Al (aluminum) film is used in this embodiment as the cathode 4019. Specifically, a 1 nm thick LiF (lithium fluoride) film is formed by evaporation on the EL layer 4018, and a 300 nm thick aluminum film is formed on the LiF film. An MgAg electrode, a known cathode material, may of course also be used. The cathode 4019 is then connected to the wiring 4007 in a region denoted by reference numeral 4020. The wiring 4007 is a power source supply line for imparting a predetermined voltage to the cathode 4019, and is connected to the FPC 4008 through a conducting paste material 4021.

In order to electrically connect the cathode 4019 and the wiring 4007 in the region denoted by reference numeral 4020, it is necessary to form a contact hole in the interlayer insulating film 4015 and the insulating film 4017. The contact holes may be formed at the time of etching the interlayer insulating film 4015 (when forming a contact hole for the pixel electrode) and at the time of etching the insulating film 4017 (when forming the opening portion before forming the EL layer). Further, when etching the insulating film 4017, etching may be performed all the way to the interlayer insulating film 4015 at one time. A good contact hole can be formed in this case, provided that the interlayer insulating film 4015 and the insulating film 4017 are the same resin material.

A passivation film 4022, a filing material 4023, and the covering material 4009 are formed covering the surface of the EL element thus made.

In addition, the sealing material 4011 is formed between the covering material 4009 and the substrate 4001, so as to surround the EL element portion, and the alright sealing material (the second sealing material) 4010 is formed on the outside of the sealing material 4011.

The filling material 4023 functions as an adhesive for bonding the covering material 4009 at this point. PVC (polyvinyl chloride), epoxy resin, silicone resin, PVB (polyvinyl butyral), and EVA (ethylene vinyl acetate) can be used as the filling material 4023. If a drying agent is formed on the inside of the filling material 4023, then it can continue to maintain a moisture absorbing effect, which is preferable.

Further, spacers may be contained within the filling material 4023. The spacers may be a powdered substance such as BaO, giving the spacers themselves the ability to absorb moisture.

When using spacers, the passivation film 4022 can relieve the spacer pressure. Further, a film such as a resin film can be formed separately from the passivation film 4022 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 4009. Note that if PVB or EVA is used as the filling material 4023, it is preferable to use a sheet with a structure in which several tens of aluminum foil ($\mu$m) is sandwiched by a PVF film or a Mylar film.

However, depending upon the light emission direction from the EL element (the light radiation direction), it is necessary for the covering material 4009 to have Light transmitting characteristics.

Further, the wiring 4007 is electrically connected to the FPC 4008 through a gap between the sealing material 4011 or the airtight sealing material 4010 and the substrate 4001. Note that although an explanation of the wiring 4007 has been made here, the wirings 4005 and 4006 are also electrically connected to the FPC 4008 by similarly passing underneath the sealing material 4011 and the airtight sealing material 4010.

In this embodiment, the covering material 4009 is bonded after forming the filling material 4023, and the sealing material 4011 is attached so as to cover the lateral surfaces (exposed surfaces) of the filling material 4023, but the filing material 4023 may also be formed after attaching the covering material 4009 and the sealing material 4011. In this case, a filling material injection opening is formed through a gap formed by the substrate 4001, the covering material 4009, and the sealing material 4011. The gap is set into a vacuum state (a pressure equal to or less than $10^{-2}$ Torr), and after immersing the injection opening in the tank holding the filling material, the air pressure outside of the gap is made higher than the air pressure within the gap, and the filling material fills the gap.

[Embodiment 4]

Figure 10:
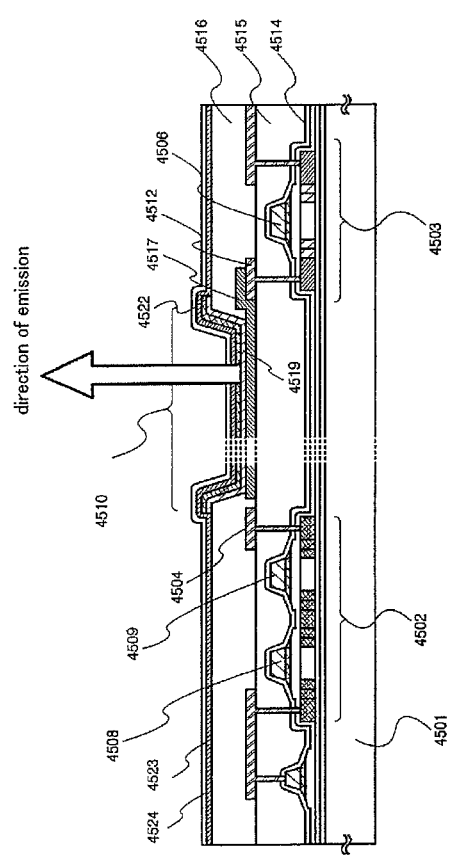
FIG. 10 is a cross sectional diagram of a pixel portion of an electronic device according to Embodiment 4.

A more detailed cross-sectional structure of the pixel portion in an electric device of the present invention is shown in FIG. 10.

In FIG. 10, a switching TFT 4502 provided on a substrate 4501 is formed by using a p-channel type TFT manufactured by a known method. In this embodiment, the TFT 4502 has a double-gate structure. Since there is no substantial difference in its structure and production process, its description will be omitted. In this embodiment, the TFT 4502 has a double-gate structure. Due to the double-gate structure, there is an advantage in that substantially two TFTs are connected in series to reduce an OFF current value. In this embodiment, the TFT 4502 has a double-gate structure; however, it may have a single gate structure, a triple gate structure, or a multi-gate structure having more gates.

An EL driver TFT 4503 is formed by using the n-channel TFT manufactured by a known method. A drain wiring 4504 (not shown in the figure) of the switching TFT 4502 is electrically connected to a gate electrode 4506 of the EL driver TFT 4503.

Furthermore, in this embodiment, the EL driver TFT 4503 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

A wiring (not shown in the figure) including the gate electrode 4506 of the EL driver TFT 4503 overlaps a drain wiring 4512 of the EL driver TFT 4503 via an insulating film in a part of the region. In the region, a capacitor is formed. The capacitor functions for holding a voltage applied to a gate electrode 4506 of the EL driver TFT 4503.

A first interlayer insulating film 4514 on the switching TFT 4502 and the EL driver TFT 4503, and the second interlayer insulating film 4515 made of resin insulating film is formed on the first interlayer insulating film 4514.

Reference numeral 4517 denotes a pixel electrode (cathode of an EL element) that is made of a conductive film with high reflectivity and is electrically connected to the drain of the EL driver TFT 4503. As the pixel electrode 4517, a low resistant conductive film such as an aluminum alloy film, a copper alloy film, and a silver alloy film, or a layered structure thereof can be preferably used. Needless to say, a layered structure with other conductive films may also be used.

An organic resin film 4516 is formed on the pixel electrode 4517 and the EL layer 4519 is formed after the patterning the portion of facing the pixel electrode 4517. Herein, not shown in the figure, light-emitting layers corresponding to each color R (red), G (green), and B (blue) may be formed. As an organic EL material for the light-emitting layer, a π-conjugate polymer material is used. Examples of the polymer material include polyparaphenylene vinylene (PPV), polyvinyl carbazole (PVK), and polyfluorene.

There are various types of PPV organic EL materials. For example, materials as described in "H. Shenk, H. Becker, O. Gelsen, E. Kluge, W. Kreuder and H. Spreitzer, "Polymers for Light Emitting Diodes", Euro Display, Proceedings, 1999, pp. 33-37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm).

The above-mentioned organic EL materials are merely examples for use as a light-emitting layer. The present invention is not limited thereto. A light-emitting layer, a electric charge transporting layer, or a electric charge injection layer may be appropriately combined to form an EL layer (for light emitting and moving carriers therefore).

For example, in this embodiment, the case where a polymer material is used for the light-emitting layer has been described. However, a low molecular-weight organic EL material may be used. Furthermore, an inorganic material such as silicon carbide can also be used for a electric charge transporting layer and a electric charge injection layer. As these organic EL materials and inorganic materials, known materials can be used.

When the anode 4523 is formed, the EL element 4510 is completed. The EL element 4510 refers to a capacitor composed of the pixel electrode (cathode) 4517, the light-emitting layer 4519, the hole injection layer 4522, and the anode 4523.

In this embodiment, a passivation film 4524 is further formed on the anode 4523. As the passivation film 4524, a silicon nitride film or a silicon nitride oxide film is preferably used. The purpose of the passivation film 4524 is to prevent the EL element from being exposed to the outside. That is, the passivation film 4524 protects an organic EL material from degradation due to oxidation, and suppresses the release of gas from the organic EL material. Because of this, the reliability of the electric device is enhanced.

As described above, the electric device has a pixel portion made of a pixel with a structure as shown in FIG. 10, and includes a switching TFT having a sufficiently low OFF current value and an EL driving TFT is strong to the injection of hot carriers. Thus, an electric device is obtained, which has high reliability and is capable of displaying a satisfactory image.

In this embodiment, light generated by the light-emitting layer 4519 is irradiated toward reverse direction to the substrate on which a TFT is formed as represented by an arrow.

[Embodiment 5]

Figure 11:
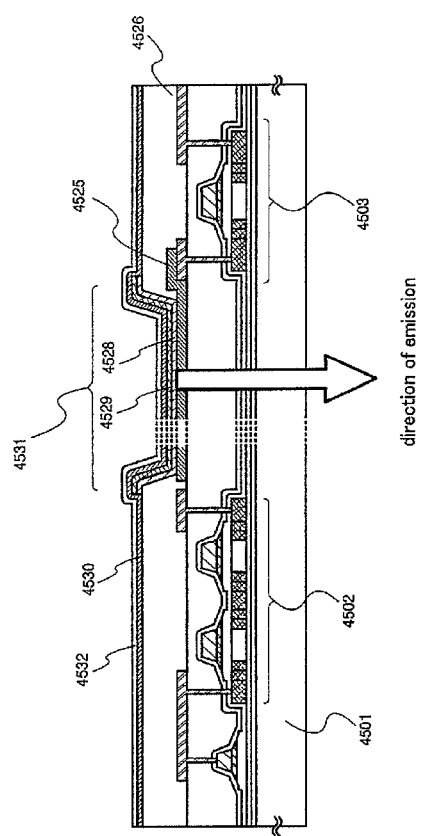
FIG. 11 is a cross sectional diagram of a pixel portion of an electronic device according to Embodiment 5.

A structure in which the structure of the EL element 4510 in the pixel portion shown in FIG. 10 in embodiment 4 is inverted is explained in embodiment 5. FIG. 11 is used in the explanation. Note that the only points of difference between the structure of FIG. 11 and that of FIG. 10 is an EL element portion and an EL driver TFT, and therefore an explanation of other portions is omitted.

The switching TFT 4502 is formed using a p-channel type TFT manufactured by a known method in FIG. 11. The EL driver TFT 4503 is formed using a p-channel type TFT manufactured by a known method.

A transparent conducting film is used as a pixel electrode (anode) 4525 in embodiment 5. Specifically, a conducting film made from a compound of indium oxide and zinc oxide is used. Of course, a conducting film made from a compound of indium oxide and tin oxide may also be used.

After then forming the third interlayer insulating film 4526, a light emitting layer 4528 is formed. An electron injecting layer 4529 is formed on the light emitting layer from potassium acetylacetonate (denoted acacK), and a cathode 4530 is formed from an aluminum alloy.

After that, as same as embodiment 5, the passivation film 4532 is formed for protecting from deterioration by an oxidation. An EL element 4531 is thus formed.

In the case that the EL element has the structure explained in this embodiment, the light generated by the light emitting layer 4528 is radiated toward the substrate on which the TFT is formed in embodiment 5, as shown by the arrows.

[Embodiment 6]

The electronic devices shown in Embodiments 4 and 5 can be easily produced even if reverse stagger type TFTs are used for the TFTs structuring the driver circuit. An explanation is made here with reference to FIG. 12. Note that locations common with Embodiment 4 and Embodiment S have reference numerals attached which are the same as those of FIG. 10 and FIG. 11.

Figure 12:
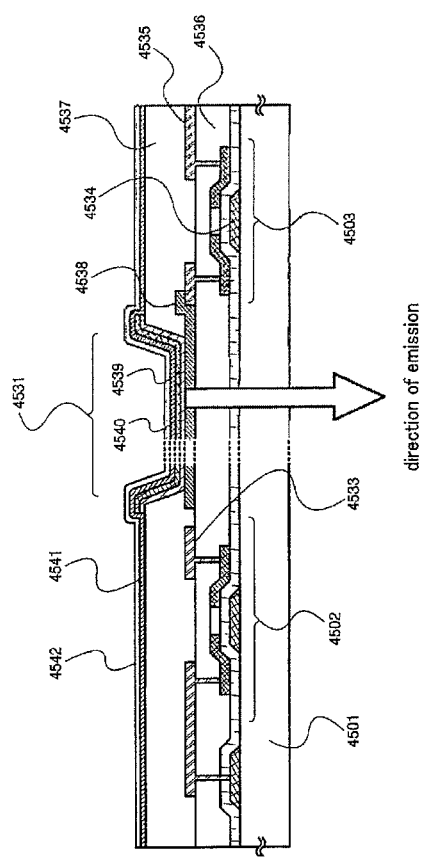
FIG. 12 is a cross sectional diagram of a pixel portion of an electronic device according to Embodiment 6.
Figure 13A:
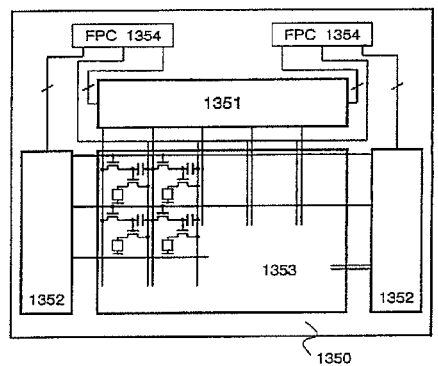
FIGS. 13A and 13B are diagrams showing examples of electronic device circuit structures.
Figure 13B:
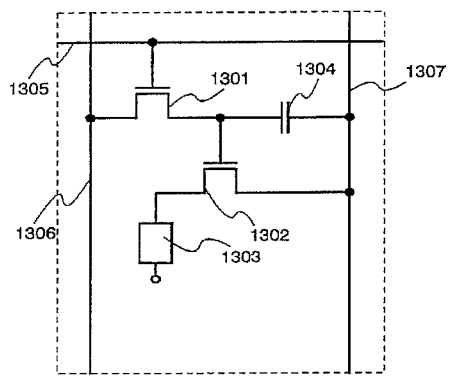
Figure 14A:
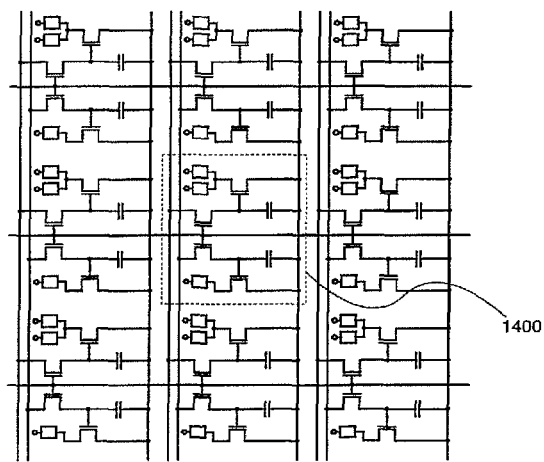
FIGS. 14A and 14B are diagrams showing examples of a pixel portion of an electronic device for performing gray scale expression in accordance with a surface area gray scale method.
Figure 14B:
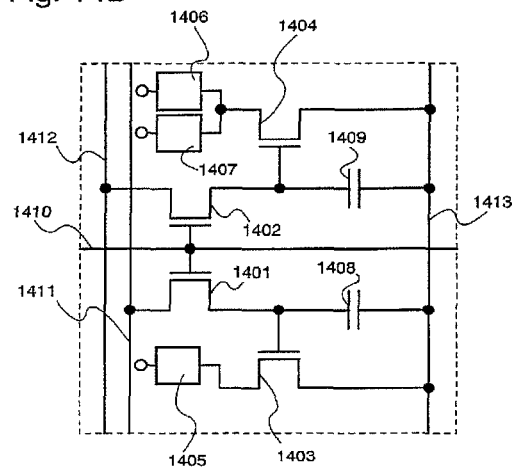
Figure 16A:
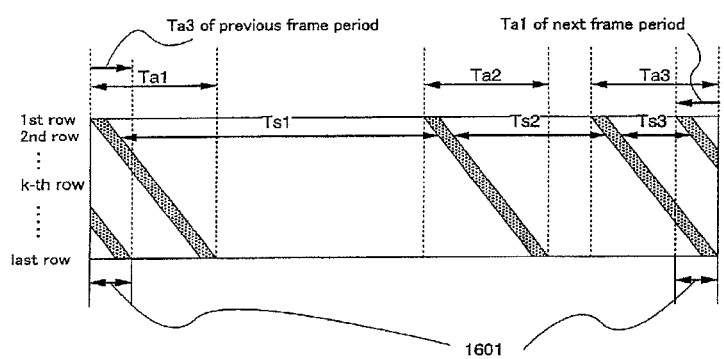
FIGS. 16A and 16B are diagrams showing overlap of an address (write in) period, and a method of solving in accordance with a non-display period, respectively.
Figure 16B:
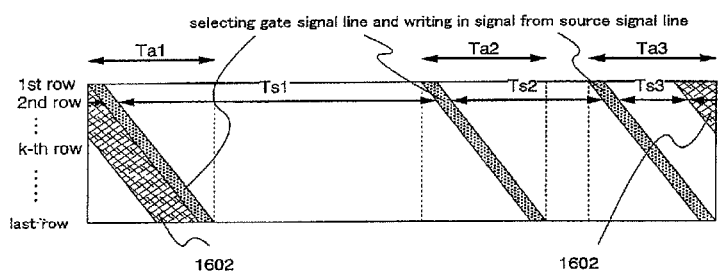

A p-channel TFT formed by a known method is used for a switching TFT 4502 formed on a substrate 4501 in FIG. 12. A single gate structure is used in Embodiment 6, but a double gate structure may also be used, and a multi-gate structure, such as a triple gate structure, having three or more gates may also be used.

Further, a p-channel TFT formed by a known method is used for an EL driver TFT 4503. A drain wiring 4533 of the switching TFT 4502 is electrically connected to a gate electrode 4534 of the EL driver TFT 4503 by a wiring (not shown in the figure).

Furthermore, although a single gate structure is shown in the figure for the EL driver TFT 4503, a multi-gate structure in which a plurality of TFTs are connected in series may also be used. In addition, a structure in which a plurality of TFTs are connected in parallel, effectively dividing a channel forming region into a plurality of channel forming regions, and which performs heat radiation at high efficiency, may also be used. This type of structure is effective as a measure against deterioration due to heat.

A wiring (not shown in the figure) containing the gate electrode 4534 of the EL driver TFT 4503 overlays with a portion of a source wiring 4535 of the EL driver TFT 4503 through an insulating film, and a storage capacitor is formed in that region. The storage capacitor has a function of storing a voltage applied to the gate electrode 4534 of the EL driver TFT 4503.

A first interlayer insulating film 4536 is formed on the switching TFT 4502 and on the EL driver TFT 4503, and a second interlayer insulating film 4537 made of a resin insulating film is formed on the first interlayer insulating film 4536.

Then, similar to Embodiment 5, a pixel electrode (anode) 4538, a light emitting layer 4539, an electron injecting layer 4540, a cathode 4541, and a passivation film 4542 are formed, forming an EL element 4531.

Light emitted by the light emitting layer 4539 is irradiated toward the substrate on which the TFTs are formed, as shown by the arrow, when the EL element has the structure explained in Embodiment 6.

[Embodiment 7]

In an electronic device having the structure shown in Embodiment 4, light from a light emitting layer 4519 is irradiated in a direction opposite to the active matrix substrate on which the TFTs are formed, as shown by the arrow in FIG. 10. It therefore becomes possible to take a very wide surface area for the light emitting portion because the emitted light is not blocked by TFTs and the like. A structure like that shown in FIGS. 18A and 18B may be used when one wants to have a pixel portion structure like that shown in FIG. 10. This structure is explained in Embodiment 7.

Figure 18A:
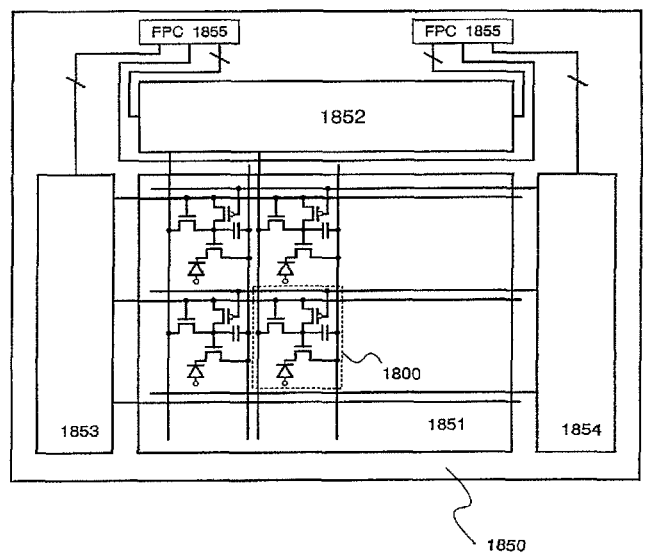
FIGS. 18A and 18B are diagrams showing examples of the circuit structures according to Embodiment 7 using the pixel of the present invention.

FIG. 18A is an example of an overall circuit structure of an electronic device shown in Embodiment 7. A pixel portion is arranged in the center. A source signal line driver circuit is arranged on the top side of the pixel portion in order to control source signal lines. To the left side of the pixel portion is arranged a gate signal line driver circuit in order to control gate signal lines. A reset signal line driver circuit is arranged on the right side of the pixel portion in order to control reset signal lines. A portion surrounded by a dotted line frame 1800 in the pixel portion is one pixel portion circuit, and an enlargement diagram is shown in FIG. 18B.

The fact that n-channel TFTs are used in a switching TFT 1801 and an EL driver TFT 1802, and the structure of an EL element 1803, differ from the circuit shown in Embodiment 1. The EL element 1803 is formed in accordance with the structure shown in FIG. 10 of Embodiment 4, and therefore reference numeral 1810 denotes a cathode, reference numeral 1811 denotes an anode, and reference numeral 1809 denotes an anode wiring.

Figure 18B:
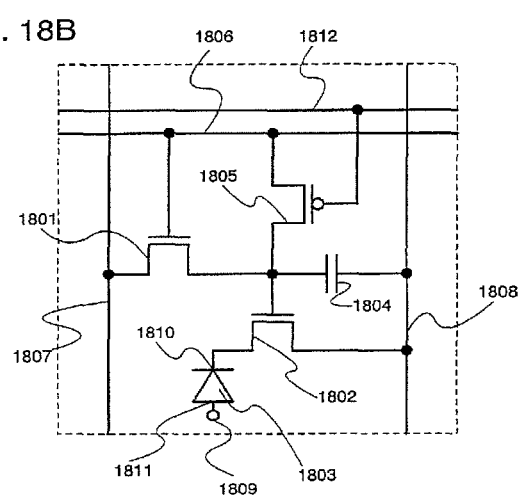

An n-channel TFT is used in the switching TFT 1801 in FIGS. 18A and 18B. The reason for this is explained below.

When a reset TFT 1805 is placed in a conducting state in a certain row of pixels, write in operation to the pixels has already been completed, and therefore the switching TFT 1801 is in a non-conducting state. Further, there are cases at that point in which the switching TFTs 1801 of other rows are conductive, and write in of a signal is being performed. In order to set the EL driver TFT 1802 into a non-conducting state with certainty in a non-display period for a case in which the threshold voltage of the EL driver TFT 1802 is shifted to a negative value, the electric potential of a gate signal line 1806 must be set lower than the electric potential of an electric current supply line 1808 by the amount of the threshold voltage of the EL driver TFT 1802 while the reset TFT 1805 is in a conducting state. If a p-channel TFT is used for the switching TFT 1801 at this point, then the switching TFT 1801 is placed in a conducting state for a case in which the absolute value of the voltage between the gate signal line 1806 and the electric current supply line 1808 becomes higher than the absolute value of the threshold voltage of the switching TFT 1801, due to a drop in the electric potential of the gate signal line 1806. An n-channel TFT is thus used in the switching TFT 1801 for the pixel shown in FIGS. 18A and 18B.

[Embodiment 8]

Figure 19A:
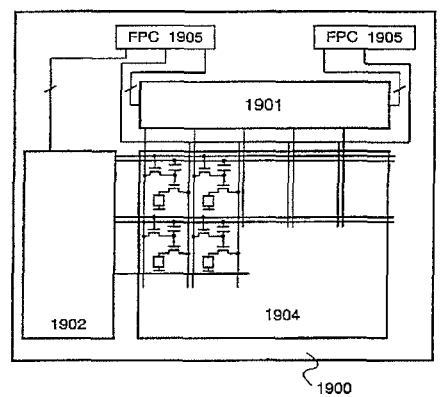
FIGS. 19A and 19B are diagrams showing examples of the circuit structures according to Embodiment 8 using the pixel of the present invention.
Figure 19B:
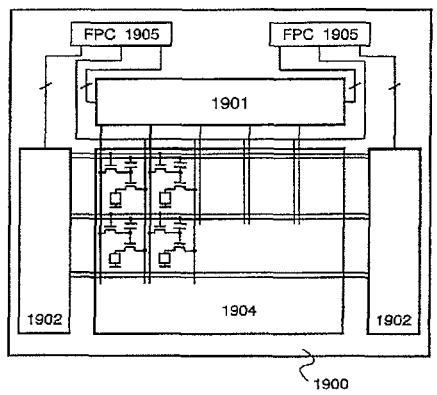

In the present invention, a reset signal line driver circuit for controlling the operation of a reset TFT is arranged in an independent circuit with the structure of the example of Embodiment 1, but a single circuit structure may also be used as shown in FIG. 19A It is then preferable to arrange the gate signal line driver circuit on both sides of the pixel portion, considering driving. Consequently, as shown in FIG. 19B, the gate signal line driver circuit and the reset signal line driver circuit may be structured as one circuit, and in addition, this may be arranged on both sides of the pixel portion.

[Embodiment 9]

It is possible to easily apply the present invention to an electronic device for performing color display of the three colors R (red), G (green), and B (blue). An example for implementation is explained below. As shown in Embodiment 7, a structure in which an n-channel TFT is used for an EL driver TFT may be adopted, but in Embodiment 9, a case in which a p-channel TFT is used for an EL driver TFT is discussed as an example, as shown in Embodiment 1.

Brightness characteristics of each color, R (red), G (green), and B (blue) differ in an EL element. Namely, the brightness differs if the same voltage is applied to am EL element having differing colors of emitted light. Consequently, there are cases in which the voltage applied to the EL elements is changed for each color in order to achieve identical brightness with the three RGB colors. It is necessary to adjust the electric potential of the electric current supply lines of each column to voltages adjusted for each color.

When the electronic device and the method of driving an electronic device of the present invention are applied to a display such as a color EL display in which the three RGB colors are separated, the electric potential of the gate signal lines may be set high with the electric potential of the electric current supply line to which the higher voltage is applied among the three colors as a basis.

However, in that case, the electric potential difference between the electric current supply lines to which the lowest voltage is applied among the three colors, and the gate signal lines, becomes very large. In other words, the gate voltage of the EL driver TFTs connected to the electric current supply lines to which the lowest voltage is applied among the three colors becomes very high, and there are canes in which the leaks of the off current of the EL driver TFTs are increased a little in those portions. However, the electric potential difference of the electric current supply lines is not extremely large, and therefore this does not become a problem.

[Embodiment 10]

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical formula 1)

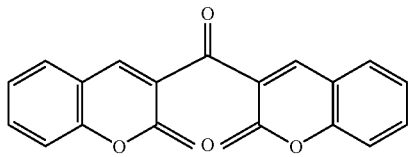

(M. A. Baldo, D.F. O'Brien, Y. You, A. Shoustikov, S. Sibley, M.E. Thompson, S.R. Forrest, Nature 395 (1998) p. 151)

The molecular formula of an EL material (Pt complex) reported by the above article is represented as follows.

(Chemical formula 2)

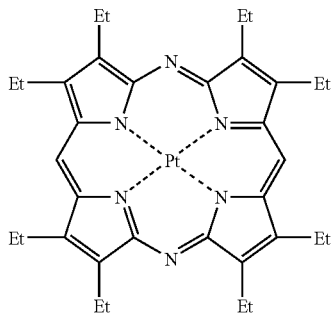

(M.A. Baldo, S. Lamansky, P.E. Burrows, M.E. Thompson, S.R. Forrest, Appl. Phys. Lett., 75 (1999) p. 4.)

(T.Tsutsui, M.-J.Yang, M. Yahiro, K. Nakamura, T.Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical formula 3)

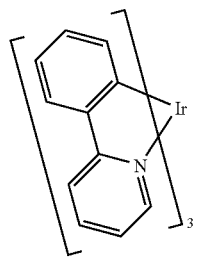

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to nineth embodiments.

[Embodiment 11]

The EL display device, which is an application of electric device and its driving method formed according to the present invention, is a self light emitting type, therefore compared to a liquid crystal display device, it has excellent visible properties and is broad in an angle of visibility. Accordingly, the self-emission device can be applied to a display portion in various electric devices. For example, in order to view a TV program or the like on a large-sized screen, the self-emission device in accordance with the present invention can be used as a display portion of an EL display device having a diagonal size of 30 inches or larger (typically 40 inches or larger).

The EL display includes all kinds of displays to be used for displaying information, such as a display for a personal computer, a display for receiving a TV broadcasting program, a display for advertisement display. Moreover, the electric device and its driving method in accordance with the present invention can be used as a display portion of other various electric devices.

As other electric equipments of the present invention there are: a video camera; a digital camera; a goggle type display (head mounted display); a navigation system; a sound reproduction system (a car audio stereo, an audio set); a notebook type personal computer; a game apparatus; a portable information terminal (such as a mobile computer, a portable telephone, a portable game machine, or an electric book); and an image playback device equipped with a recording medium (specifically, device provided with a display portion which plays back images in a recording medium such as a digital versatile disk player (DVD), and displays the images). In particular, in the case of the portable information terminal, use of the self-emission device is preferable, since the portable information terminal that is likely to be viewed from a tilted direction is often required to have a wide viewing angle. Specific examples of those electric equipments are shown in FIGS. 20A to 21B.

Figure 20A:
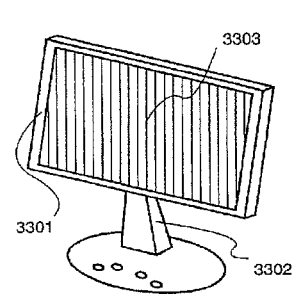
FIGS. 20A to 20F are diagrams showing examples of electronic equipment, according to Embodiment 11, which apply the method of driving an electronic device of the present invention.

FIG. 20A shows an EL display containing a casing 3301, a support stand 3302, and a display portion 3303. The light emitting device of the present invention can be used as the display portion 3303. Such an EL display is a self light emitting type so that a back light is not necessary. Thus, the display portion can be made thinner than that of a liquid crystal display.

Figure 20B:
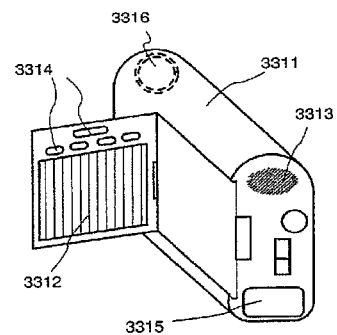

FIG. 20B shows a video camera, and contains a main body 3311, a display portion 3312, a sound input portion 3313, operation switches 3314, a battery 3315, and an image receiving portion 3316. The electric device and its driving method of the present invention can be used as the display portion 3312.

Figure 20C:
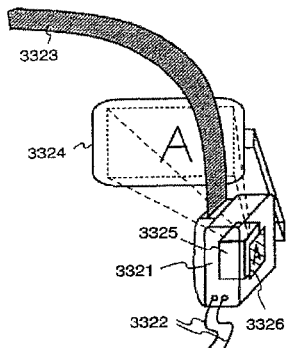

FIG. 20C shows a portion (the right-half piece) of an EL display of head mount type, which includes a main body 3321, signal cables 3322, a head mount band 3323, a display portion 3324, an optical system 3325, a display portion 3326, or the Like. The electric device and its driving method of the present invention is applicable to the display portion 3326.

Figure 20D:
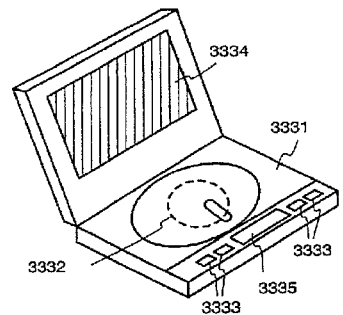

FIG. 20D shows an image playback device equipped with a recording medium (specifically, a DVD playback device), and contains a main body 3331, a recording medium (such as a DVD) 3332, operation switches 3333, a display portion (a) 3334, and a display portion (b) 3335. The display portion (a) 3334 is mainly used for displaying image information. The display portion (b) 3335 is mainly used for displaying character information. The electric device and its driving method of the present invention can be used as the display portion (a) 3334 and as the display portion (b) 3335. Note that the image playback device equipped with the recording medium includes devices such as game machines for home.

Figure 20E:
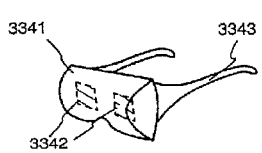

FIG. 20E shows a goggle type display device (head mount display), and contains a main body 3341, a display portion 3342 and an arm portion 3343. The electric device and its driving method of the present invention is applicable to the display portion 3342.

Figure 20F:
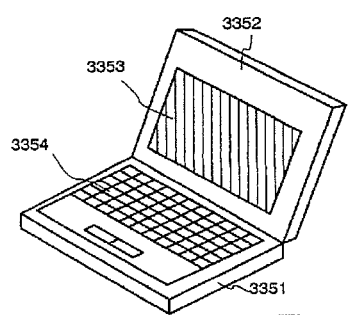

FIG. 20F is a personal computer, and contains a main body 3351, a casing 3352, a display portion 3353, and a keyboard 3354. The electric device and its driving method of the present invention is applicable to the display portion 3353.

Note that if the luminance of EL material increases in the future, then it will become possible to use the light emitting device of the present invention in a front type or a rear type projector by expanding and projecting light containing output image information with a lens or the like.

Further, the above electric devices display often information transmitted through an electric communication circuit such as the Internet and CATV (cable TV), and particularly situations of displaying moving images is increasing. The response speed of EL materials is so high that the above electric devices are good for display of moving image.

In addition, since the EL display device conserves power in the light emitting portion, it is preferable to display information so as to make the light emitting portion as small as possible. Consequently, when using the EL display device in a display portion mainly for character information, such as in a portable information terminal, in particular a portable telephone or a sound reproduction device, it is preferable to drive the EL display device so as to form character information by the light emitting portions while non-light emitting portions are set as background.

Figure 21A:
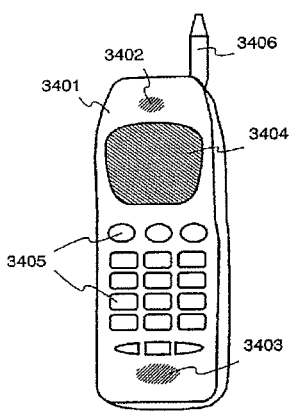
FIGS. 21A and 21B are diagrams showing examples of electronic equipment, according to Embodiment 11, which apply the method of driving an electronic device of the present invention.

FIG. 21A shows a portable telephone, and contains a main body 3401, a sound output portion 3402, a sound input portion 3403, a display portion 3404, operation switches 3405, and an antenna 3406. The light emitting device of the present invention can be used as the display portion 3404. Note that by displaying white color characters in a black color background, the display portion 3404 can suppress the power consumption of the portable telephone.

Figure 21B:
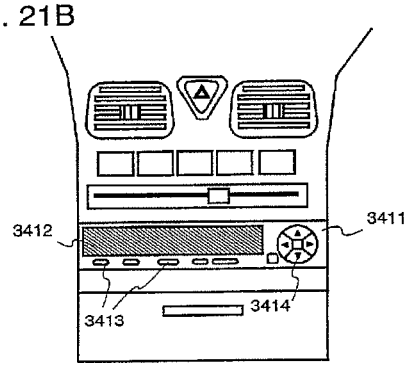

FIG. 21B shows a sound reproduction device, a car audio stereo in a concrete term, and contains a main body 3411, a display portion 3412, and operation switches 3413 and 3414. The light emitting device of the present invention can be used as the display portion 3412. Further, a car mounting audio stereo is shown in this embodiment, but a portable type audio playback device or a home type device may also be used. Note that, by displaying white color characters in a black color background, the display portion 3414 can suppress the power consumption. It is especially effective to portable sound reproduction device.

In the case of the portable electric device shown in this embodiment, the sensor portion is provided to perceive the external light and the function to lower the brightness of display when it is used in the dark area as a method to lower the power consumption.

As described above, the application range of this invention is extremely wide, and it may be used for electric devices in various fields. Further, the electric device of this embodiment may be obtained by freely combining the structures of the first to tenth embodiments.

The effect of the present invention is discussed.

The overlap of differing address (write in) periods can be avoided with the present invention, even for cases having short sustain (turn on) periods which cannot be set with a normal time gray scale method, by forming non-display periods. It therefore becomes possible to increase the number of gray scales.

In addition, the gate voltage of an EL driver TFT (the electric potential of a gate electrode with respect to a source region of the EL driver TFT) can be made into a positive value when the non-display periods are formed with a reset TFT in a conducting state by regulating the electric potential of a gate signal line. Electric current can thus be prevented from being supplied to an EL element in accordance with the input of a reset signal even for a case in which the threshold voltage of the EL driver TFT is shifted to a positive value.

Chemical Formula 1

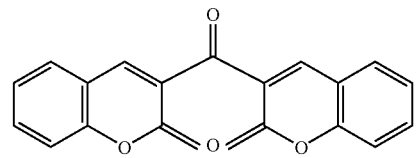

Chemical Formula 2

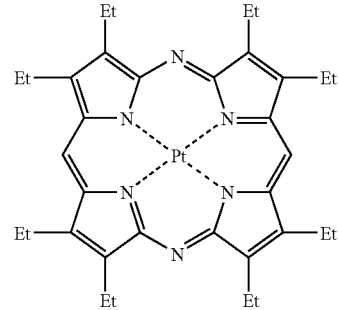

Chemical Formula 3

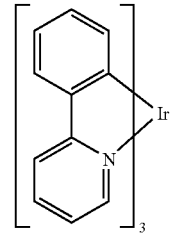

What is claimed is:

1. An electronic device comprising:
a first substrate;
a pixel over the first substrate, and comprising:
an electroluminescent element;
a capacitor;
a first transistor having a gate electrode electrically connected to a first line, and one of impurity regions electrically connected to a third line;
a second transistor having a gate electrode electrically connected to the capacitor, one of impurity regions electrically connected to a fourth line, and another of the impurity regions electrically connected to the electroluminescent element; and
a third transistor having a gate electrode electrically connected to a second line, and one of impurity regions electrically connected to the capacitor,
wherein at least one of the gate electrode of the second transistor and the one of the impurity regions of the third transistor are directly connected to another of the impurity regions of the first transistor,
wherein another one of impurity regions of the third transistor is electrically connected to the first line, and
wherein the first transistor, the second transistor and the third transistor have a same conductivity type.

2. An electronic device according to claim 1, wherein another one of impurity regions of the first transistor is electrically connected to the capacitor.

3. An electronic device according to claim 1, wherein the capacitor is electrically connected to the fourth line.

4. An electronic device according to claim 1, wherein the electronic device is a device selected from the group consisting of an electroluminescence display, a video camera, a head mounted display, a DVD player, a personal computer, a portable telephone and a car audio system.

5. An electronic device according to claim 1, further comprising:
a flexible printed circuit on the first substrate;
a second substrate over the pixel;
a first sealing material between the first substrate and the second substrate, wherein the first sealing material is disposed along peripheries of the first substrate and the second substrate; and
a second sealing material formed outside of the first sealing material,
wherein the second sealing material covers a portion of the flexible printed circuit fixed to the first substrate and is in contact with a side surface of the second substrate but not with a side surface of the first substrate, and
wherein the pixel is sealed by the first substrate, the second substrate, the first sealing material, and the second sealing material.

6. An electronic device comprising:
a first substrate;
a pixel over the first substrate, and comprising:
an electroluminescent element;
a capacitor;
a first transistor having a gate electrode electrically connected to a first line, one of impurity regions electrically connected to a third line;
a second transistor having a gate electrode electrically connected to the capacitor, one of impurity regions electrically connected to a fourth line, and another of the impurity regions electrically connected to the electroluminescent element; and
a third transistor having a gate electrode electrically connected to a second line, and one of impurity regions electrically connected to the capacitor,
wherein at least one of the gate electrode of the second transistor and the one of the impurity regions of the third transistor are directly connected to another of the impurity regions of the first transistor,
wherein another one of impurity regions of the third transistor is electrically connected to the first line,
wherein the first transistor, the second transistor and the third transistor have a same conductivity type,
wherein an electric potential of the first line is lower than the fourth line when the first transistor is in a conductive state, and
wherein an electric potential of the first line is higher than the fourth line when the first transistor is not in a conductive state.

7. An electronic device according to claim 6, wherein another one of impurity regions of the first transistor is electrically connected to the capacitor.

8. An electronic device according to claim 6, wherein the capacitor is electrically connected to the fourth line.

9. An electronic device according to claim 6, wherein the electronic device is a device selected from the group consisting of an electroluminescence display, a video camera, a head mounted display, a DVD player, a personal computer, a portable telephone and a car audio system.

10. An electronic device according to claim 6, further comprising:
a second substrate over the pixel;
a first sealing material between the first substrate and the second substrate, wherein the first sealing material is disposed along peripheries of the first substrate and the second substrate; and
a second sealing material formed outside of the first sealing material,
wherein the second sealing material covers a portion of a flexible printed circuit fixed to the first substrate and is in contact with a side surface of the second substrate but not with a side surface of the first substrate, and
wherein the pixel is sealed by the first substrate, the second substrate, the first sealing material, and the second sealing material.

11. An electronic device comprising:
a pixel provided over a first substrate, and comprising:
an electroluminescent element;
a capacitor;
a first transistor having a gate electrode electrically connected to a first line, and one of impurity regions electrically connected to a third line;
a second transistor having a gate electrode electrically connected to the capacitor, one of impurity regions electrically connected to a fourth line, and another of the impurity regions electrically connected to the electroluminescent element; and
a third transistor having a gate electrode electrically connected to a second line, and one of impurity regions electrically connected to the capacitor; and
a circuit provided over the first substrate, and controlling an electric potential of the first line,
wherein at least one of the gate electrode of the second transistor and the one of the impurity regions of the third transistor are directly connected to another of the impurity regions of the first transistor,
wherein another one of impurity regions of the third transistor is electrically connected to the first line, and
wherein the first transistor, the second transistor and the third transistor have a same conductivity type.

12. An electronic device according to claim 11, wherein another one of impurity regions of the first transistor is electrically connected to the capacitor.

13. An electronic device according to claim 11, wherein the capacitor is electrically connected to the fourth line.

14. An electronic device according to claim 11, wherein the electronic device is a device selected from the group consisting of an electroluminescence display, a video camera, a head mounted display, a DVD player, a personal computer, a portable telephone and a car audio system.

15. An electronic device according to claim 11, further comprising:
a second substrate over the pixel;
a first sealing material between the first substrate and the second substrate, wherein the first sealing material is disposed along peripheries of the first substrate and the second substrate; and
a second sealing material formed outside of the first sealing material,
wherein the second sealing material covers a portion of a flexible printed circuit fixed to the first substrate and is in contact with a side surface of the second substrate but not with a side surface of the first substrate, and
wherein the pixel is sealed by the first substrate, the second substrate, the first sealing material, and the second sealing material.

* * * * *

UNITED STATES PATENT AND TRADEMARK OFFICE
CERTIFICATE OF CORRECTION

PATENT NO. : 8,514,151 B2  
APPLICATION NO. : 12/498131  
DATED : August 20, 2013  
INVENTOR(S) : Hajime Kimura It is certified that error appears in the above-identified patent and that said Letters Patent is hereby corrected as shown below:

In the Specification

Column 8, line 67, replace "SF" with --$SF_1$--;

Column 9, line 44, replace "lire" with --line--;

Column 10, line 64, replace "Hie" with --Hei--;

Column 11, line 55, replace "timinag" with --timing--;

Column 14, line 22, replace "torn" with --turn--;

Column 15, line 49, after "200" replace "m" with --nm--;

Column 16, line 5, after "400" replace "$ml/cm^2$" with --$mJ/cm^2$--;

Column 16, line 19, after "Embodiment" replace "Z" with --2--;

Column 18, line 11, replace "$C_2$" with --$Cl_2$--;

Column 18, line 51, replace "$1\times10^{15}$" with --$1\times10^{18}$--;

Column 19, line 34, replace "fihm" with --film--;

Column 19, line 43, replace "mearing" with --meaning--;

Column 21, line 2, after "cathode" replace "," with --.--;

Column 23, line 49, replace "filing" with --filling--;

Column 23, line 54, replace "alright" with --airtight--;

Column 24, line 15, replace "Light" with --light--;

Signed and Sealed this  
Eleventh Day of March, 2014

Michelle K. Lee  
*Deputy Director of the United States Patent and Trademark Office*

CERTIFICATE OF CORRECTION (continued)
U.S. Pat. No. 8,514,151 B2

Column 24, line 28, replace "filing" with --filling--;

Column 26, line 45, after "Embodiment" replace "S" with --5--;

Column 28, line 14, after "19A" insert --.--;

Column 28, line 31, replace "am" with --an--;

Column 30, line 52, replace "Like" with --like--.